US011081169B2

(12) United States Patent
Nakamura et al.

(10) Patent No.: US 11,081,169 B2
(45) Date of Patent: Aug. 3, 2021

(54) SEMICONDUCTOR DEVICE AND DATA RETENTION METHOD

(71) Applicant: RENESAS ELECTRONICS CORPORATION, Tokyo (JP)

(72) Inventors: Daisuke Nakamura, Tokyo (JP); Yoshisato Yokoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 32 days.

(21) Appl. No.: 16/577,465

(22) Filed: Sep. 20, 2019

(65) Prior Publication Data

US 2020/0143876 A1 May 7, 2020

(30) Foreign Application Priority Data

Nov. 2, 2018 (JP) .............................. JP2018-207037

(51) Int. Cl.
*G11C 11/412* (2006.01)
*G11C 11/417* (2006.01)
*H01L 27/02* (2006.01)
*H01L 27/11* (2006.01)
*G11C 11/419* (2006.01)

(52) U.S. Cl.
CPC ........ *G11C 11/4125* (2013.01); *G11C 11/417* (2013.01); *G11C 11/419* (2013.01); *H01L 27/0207* (2013.01); *H01L 27/1104* (2013.01)

(58) Field of Classification Search
CPC . G11C 11/4125; G11C 11/417; G11C 11/419; H01L 27/0207; H01L 27/1104

USPC ......................................................... 365/156
See application file for complete search history.

(56) References Cited

U.S. PATENT DOCUMENTS

| 6,657,911 | B2* | 12/2003 | Yamaoka | ............... | G11C 11/419 |
| | | | | | 365/226 |
| 7,990,208 | B2* | 8/2011 | Mizuno | ................ | G11C 11/413 |
| | | | | | 327/544 |
| 2011/0022826 | A1* | 1/2011 | More | ........................ | G06F 1/26 |
| | | | | | 713/1 |
| 2014/0013140 | A1* | 1/2014 | Segawa | ................. | G06F 1/3234 |
| | | | | | 713/323 |
| 2019/0079574 | A1* | 3/2019 | Hanson | ................. | G06F 1/3203 |

FOREIGN PATENT DOCUMENTS

JP          2017-174490 A          9/2017

* cited by examiner

*Primary Examiner* — Sung Il Cho
(74) *Attorney, Agent, or Firm* — McDermott Will & Emery LLP

(57) ABSTRACT

A semiconductor device has a first memory circuit comprising a first memory cell comprising a first field effect transistor, a second memory circuit comprising a second memory cell comprising a second field effect transistor, and a regulator for converting the first power supply potential to a second voltage value lower than the voltage value of the first power supply potential. The second gate length of the second field effect transistor is longer than the first gate length of the first field effect transistor, the first memory cell is supplied with a second power supply potential through regulator, and the second memory cell is supplied with a first power supply potential.

17 Claims, 24 Drawing Sheets

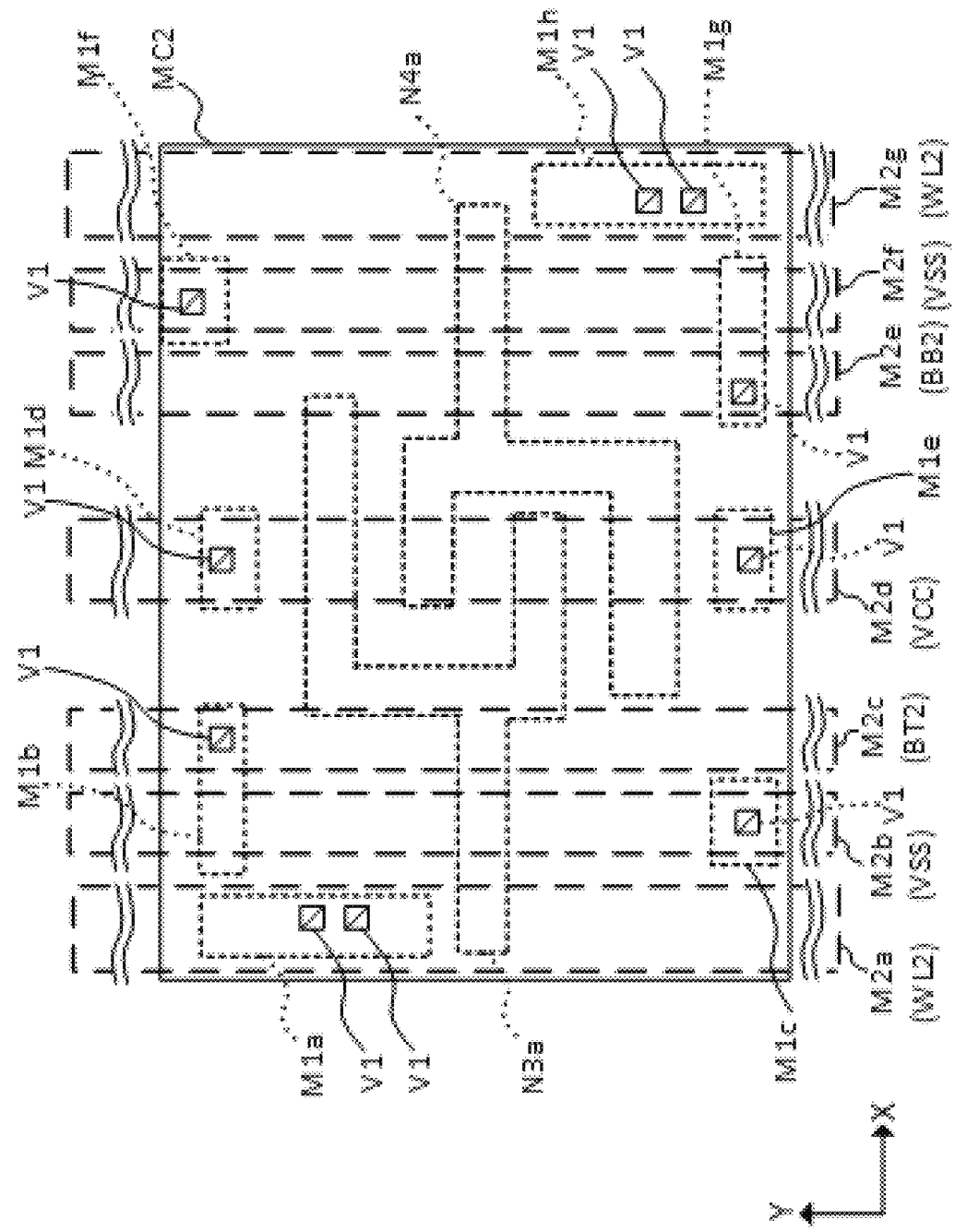

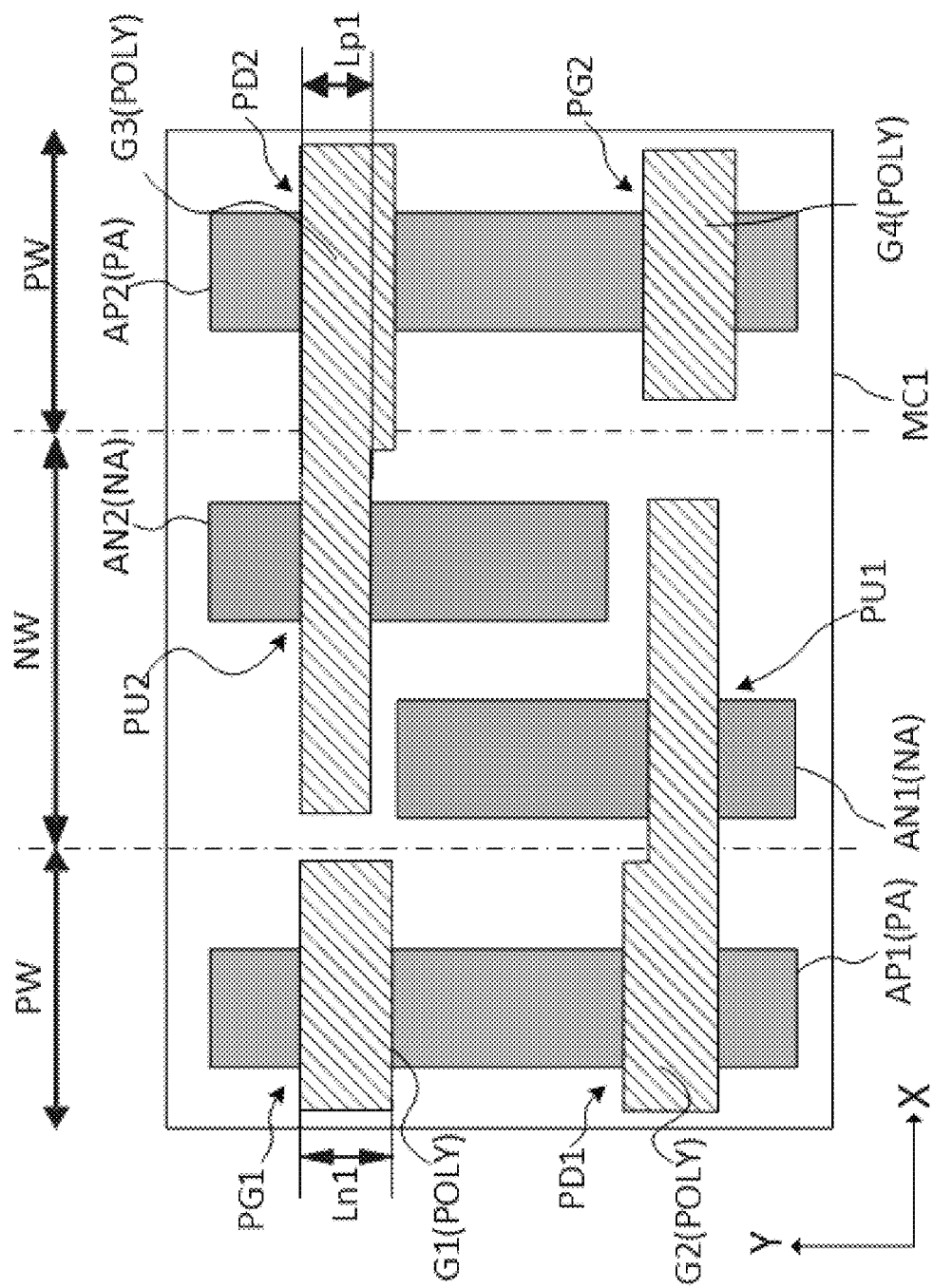

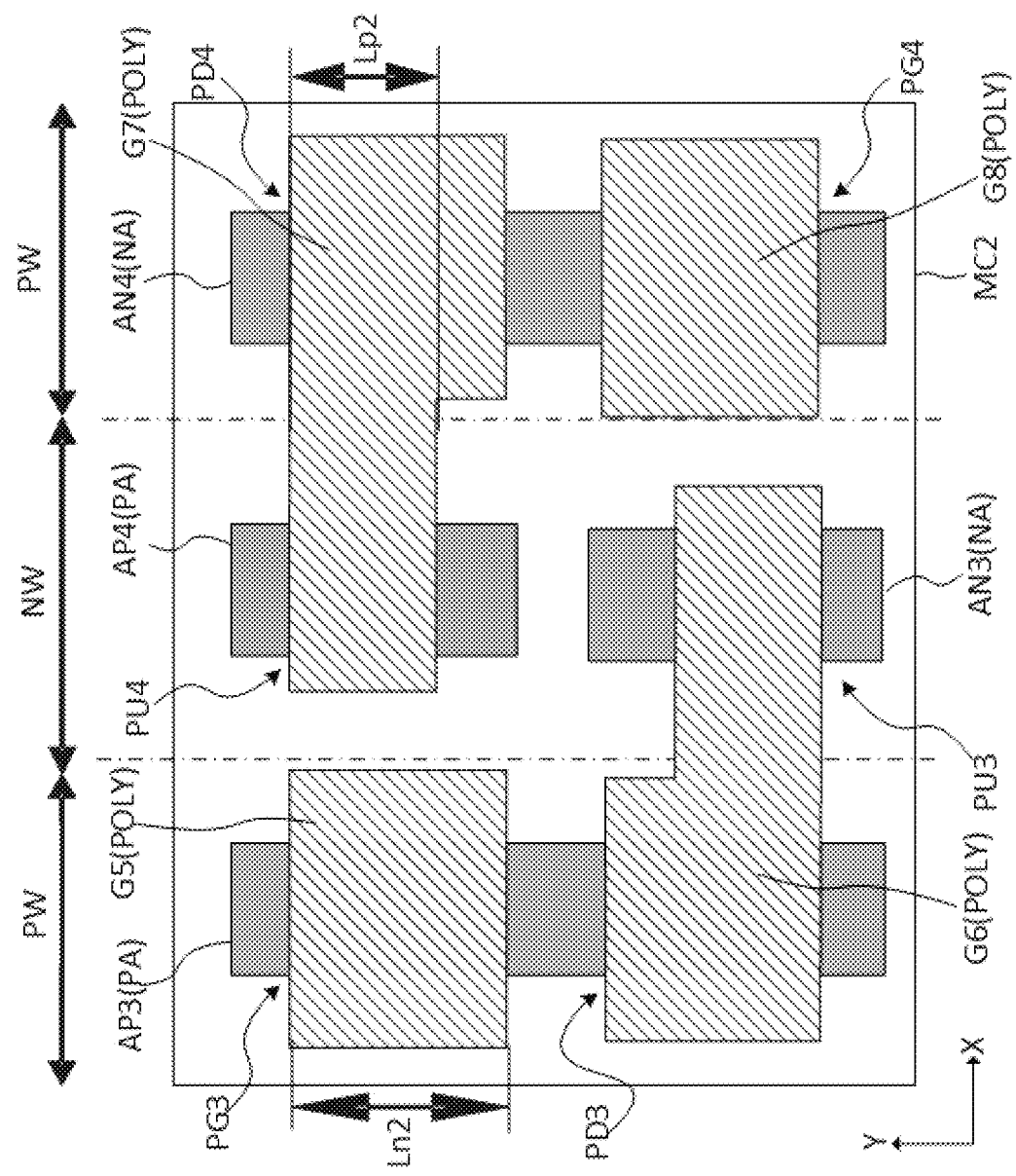

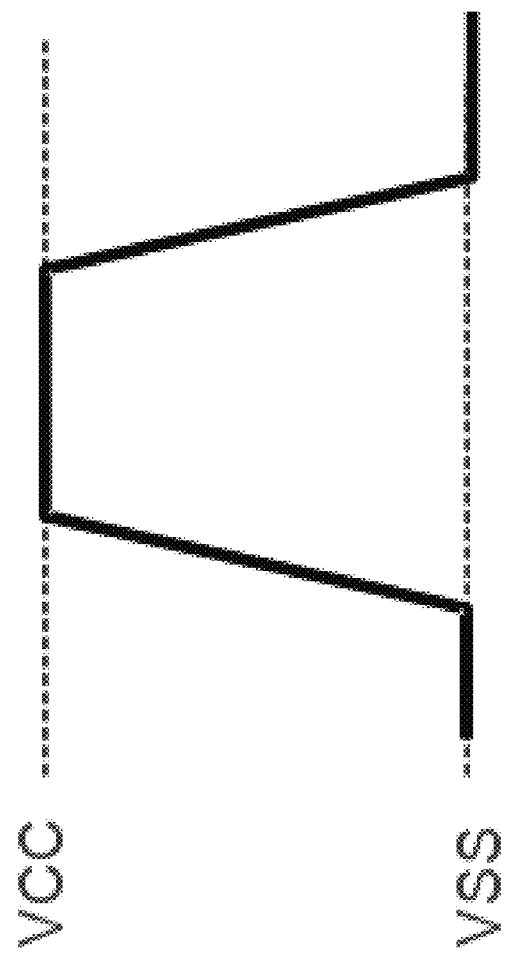

SEMICONDUCTOR DEVICE AND DATA RETENTION METHOD

CROSS-REFERENCE TO RELATED APPLICATIONS

The disclosure of Japanese Patent Application No. 2018-207037 filed on Nov. 2, 2018 including the specification, drawings and abstract is incorporated herein by reference in its entirety.

BACKGROUND

The present disclosure relates to a semiconductor device and a data retention method, and to a technique useful for application to a semiconductor device having a SRAM (Static Random Access Memory), for example. Japanese unexamined Patent Application publication No. 2017-174490 discloses that the voltage value (e.g., 1.2V) supplied to the logic circuit and the SRAM circuit is lower than the voltage value (e.g., 3.3V) supplied to the input/output circuit.

SUMMARY

Generally, when a low voltage value (e.g., 1.2V) is supplied, it is conceivable to step down the high voltage value (e.g., 3.3V) to a low voltage value, using a regulator. However, the above use requires power to drive the regulator. This tends to increase the power consumption of the semiconductor device.

Other objects and novel features will become apparent from the description of this specification and the accompanying drawings.

The semiconductor device according to one embodiment comprises a first memory cell including a first field effect transistor, a second memory cell including a second field effect transistor, and a regulator which converts a first power supply potential to a second power supply potential having a voltage value lower than that of the first power supply potential. The gate length of the second field effect transistor is longer than the gate length of the first field effect transistor. A second power supply potential is supplied to the first memory cell through the regulator. Further, the first power supply potential is supplied to the second memory cell.

A semiconductor device according to another embodiment comprises a first memory cell of a static type including a first field effect transistor, a second memory cell of a static type including a second field effect transistor, a first memory circuit including the first memory cell, a second memory circuit including the second memory cell, and a regulator which converts a first power supply potential to a second power supply potential having a voltage value lower than that of the first power supply potential. The thickness of the second insulating film of the second field effect transistor is thicker than the thickness of the first insulating film of the first field effect transistor. In the first mode, the second power supply potential is supplied to the first memory cell through the regulator. In the second mode, the first power supply potential is supplied to the second memory cell. In the first mode, the second power supply potential is supplied to the first memory circuit through the regulator. Further, in the second mode, the first power supply voltage supplied to the regulator is cut off.

A data retention method of a semiconductor device according to another embodiment includes a process supplying a first power supply potential to a regulator and a second memory cell, and supply a second power supply voltage, converted through the regulator to have a lower voltage value than that of the first power supply potential, to a first memory cell respectively, and moving data stored in the first memory cell to the second memory cell. The method further includes a process of keep supplying the first power supply voltage to the second memory cell, while cutting off the first power supply voltage supplied to the regulator.

In the semiconductor device according to one embodiment, the power consumed by the semiconductor device can be reduced.

BRIEF DESCRIPTION OF THE DRAWINGS

FIG. 6 is a plan layout diagram of the first metal wiring layer and the second metal wiring layer in the upper layer of the second memory cell in the First Embodiment.

FIG. 8A is a plan layout diagram of the first memory cell in a Second Embodiment.

FIG. 8B is a plan layout diagram of the second memory cell in the Second Embodiment.

FIG. 18A is a diagram for explaining the effect of the Fifth Embodiment.

DETAILED DESCRIPTION

Figure 1:
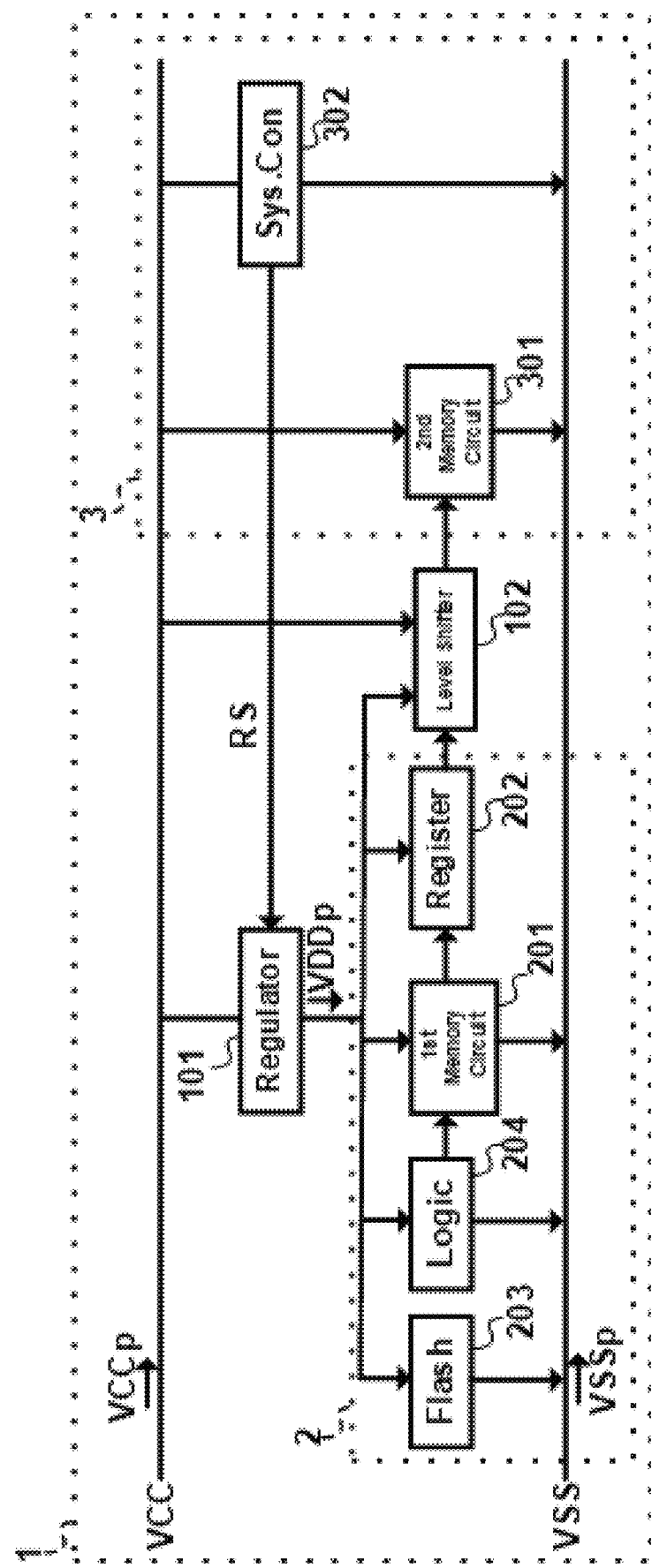
FIG. 1 is a diagram of a semiconductor device in a First Embodiment.

Hereinafter, the semiconductor device according to the respective embodiments will be described in detail by referring to the drawings. In the specification and the drawings, the same or corresponding constituent elements are denoted by the same reference numerals, and a repetitive description thereof is omitted. In the drawings, for convenience of description, the configuration may be omitted or simplified. Also, at least some of the embodiments and each modified example may be arbitrarily combined with each other.

First Embodiment

FIG. 1 shows a block diagram of a circuit of a semiconductor device 1 in the present embodiment. The first power supply VCC supplies a first power supply potential VCCp. The ground power supply VSS supplies a ground potential VSSp. The semiconductor device 1 is supplied with a first power supply potential VCCp supplied thereto and a ground potential VSSp of a voltage value lower than the first power supply potential VCCp. The first power supply potential VCCp is converted by the regulator 101 (second power supply VDD) into a second power supply potential VDDp having a voltage value higher than the ground potential VSSp and lower than the first power supply potential VCCp. As the regulator 101, for example, a linear regulator or a switching regulator is used. The semiconductor device 1 has a core region 2 and a high withstand voltage region 3 that differs from the core region 2. The core region 2 is a region to which the second power supply potential VDDp, which is stepped down by the first power supply potential VCCp, is supplied through the regulator 101. On the other hand, the high withstand voltage region 3 is a region to which the first power supply potential VCCp is directly supplied. Each of the core region 2 and the high withstand voltage region 3 is also a region to which the same ground potential VSSp is supplied. The core region 2 and the high withstand voltage region 3 are formed on a semiconductor chip (not shown) included in the semiconductor device 1.

In the core region 2 of the semiconductor device 1, a first memory circuit 201, a register 202, a flash memory 203, and a logic circuit 204 are arranged, each of which are operated by a second power supply potential VDDp and a ground potential VSSp. The first memory circuit 201 stores the operation results of the logic circuit 204. That is, the second power supply potential VDDp stepped down by the first power supply potential VCCp is supplied to the first memory circuit 201 through the regulator 101. The second power supply potential VDDp supplied to the core region 2 has a potential of, for example, 1.1V, and the ground potential VSSp has a potential of, for example, 0V.

The high withstand voltage region 3 of the semiconductor device 1 is supplied with the first power supply potential VCCp and the ground potential VSSp. In the high withstand voltage region 3, a second memory circuit 301 and a system controller 302 are disposed, each of which are operated by a first power supply potential VCCp and a ground potential VSSp. The system controller 302 controls the power supply of the regulator 101. The first power supply potential VCCp is directly supplied to the second memory circuit 301 without passing through the regulator 101. The first power supply potential VCCp supplied to the high withstand voltage region 3 is, for example, a potential of 3.3V.

A level shifter 102 is connected between the core region 2 and the high withstand voltage region 3. The level shifter 102 adjusts the potentials of signals exchanged between the core region 2 and the high withstand voltage region 3. That is, the level shifter 102 converts the potential of the signal. For example, when the high level (H level) of the signal in the core region 2 is 1.1V while the high level (H level) of the signal in the high withstand voltage region 3 is 3.3V, the signal at the H level of 1.1V provided from the core region 2 is converted to 3.3V and transmitted to the high withstand voltage region 3.

The register 202 is electrically connected to the first memory circuit 201 and the second memory circuit 301, and transfers data between the first memory circuit 201 and the second memory circuit 301.

The first memory circuit 201 includes a plurality of first memory cells MC1 arranged in a matrix. The memory cell MC described later with reference to FIG. 3 corresponds to the first memory cell MC1.

Figure 2A:
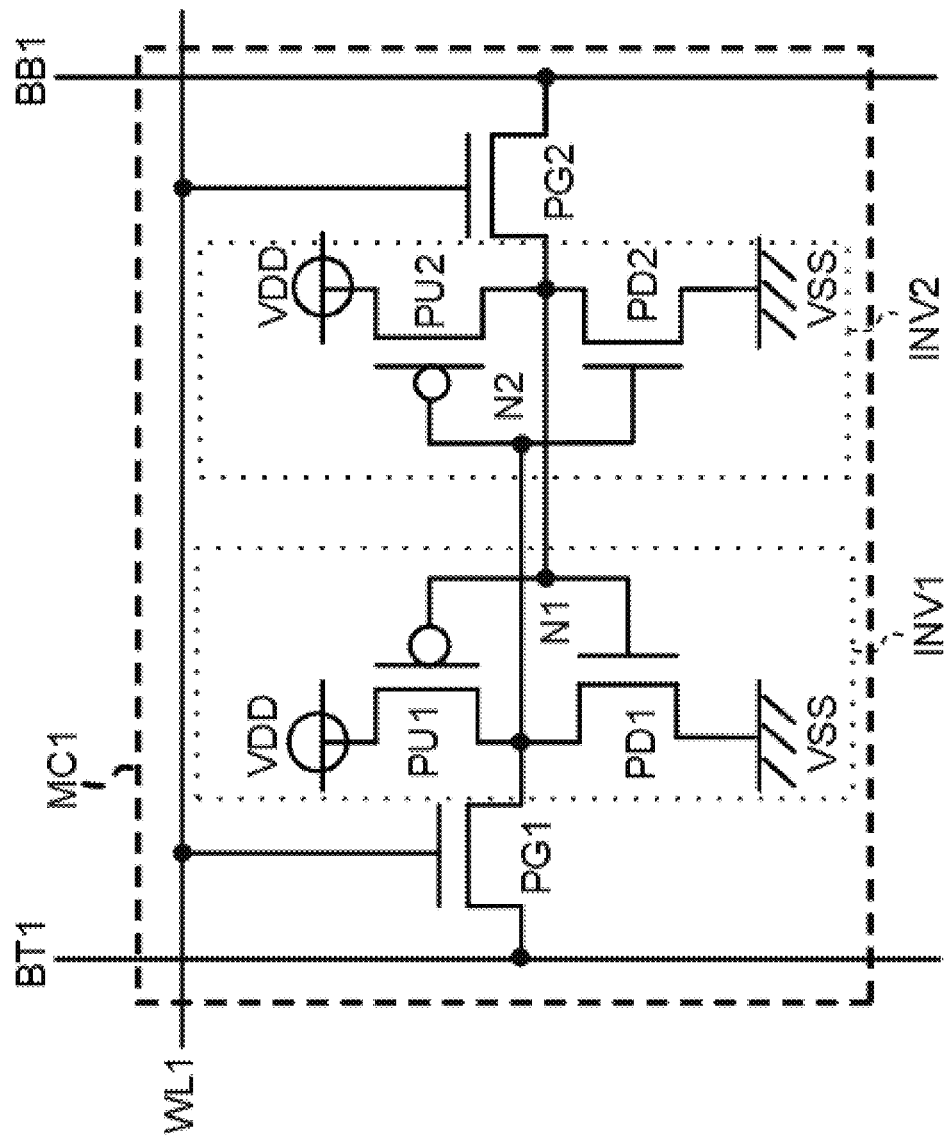
FIG. 2A is a circuit diagram of a first memory cell in the First Embodiment.

FIG. 2A shows a circuit diagram of the first memory cell MC1. As shown in the drawing 2A, the first memory cell MC1 includes a first inverter INV1 and a second inverter INV2.

As shown in the drawing 2A, the first invertor INV1 has a first pull up transistor PU1 and a first pull down transistor PD1 formed between the second power supply VDD and the ground power supply VSS. As shown in the drawing 2A, the first pull up transistor PU1 and the first pull down transistor PD1 are connected in series between the second power supply VDD and the ground power supply VSS.

On the other hand, the second inverter INV2 has the same configuration as that of the first inverter INV1. Specifically, the second inverter INV2 has a second pull up transistor PU2 and a second pull down transistor PD2 formed between the second power supply VDD and the ground power supply VSS, as shown in the drawing 2A. As shown in the drawing 2A, the second pull up transistor PU2 and the second pull down transistor PD2 are connected in series between the second power supply VDD and the ground power supply VSS.

Here, as shown in the drawing 2A, the first pull up transistor PU1 constituting the first inverter INV1 and the second pull up transistor PU2 constituting the second inverter INV2 are p-channel type field effect transistor. On the other hand, as shown in the drawing 2A, the first pull down transistor PD1 constituting the first inverter INV1 and the second pull down transistor PD2 constituting the second inverter INV2 are n-channel field effect transistor.

As shown in the drawing 2A, the respective gate electrodes of the first pull up transistor PU1 and the first pull down transistor PD1 constituting the first inverter INV1 are electrically connected to the output portion of the second inverter INV2 via the first storage node (wiring, wiring pattern) N1. Here, the output portion of the second inverter INV2 corresponds to a node in which the drain of the second pull up transistor PU2 and the drain of the second pull down transistor PD2 are connected to each other in the FIG. 2A. A second pass gate transistor PG2 is also connected to the output portion of the second invertor INV2, as shown in FIG. 2A. The gate of the second pass gate transistor PG2 is connected to the first word line WL1, and the drain or the source of the second word line pass gate transistor, which is connected to the output portion of the second inverter INV2, is connected to the first bit line BB1.

On the other hand, as shown in the drawing 2A, the respective gate electrodes of the second pull up transistor PU2 and the second pull down transistor PD2 constituting the second inverter INV2 are electrically connected to the output portion of the first inverter INV1 via the second storage node (wiring, wiring pattern) N2. Here, the output portion of the first inverter INV1 corresponds to a node in which the drain of the first pull up transistor PU1 and the drain of the first pull down transistor PD1 are connected to each other in the FIG. 2A. As shown in FIG. 2A, a first pass gate transistor PG1 is also connected to the output portion of the first inverter INV1. The gate of the first pass gate transistor PG1 is connected to the first word line WL1, and the drain or the source of the first word line pass gate transistor, which is connected to the output portion of the first inverter INV1, is connected to the first bit line BT1.

The second memory circuit 301 includes second memory cells MC2 arranged in a matrix. Similar to the first memory cell MC1, the memory cell MC described later with reference to FIG. 3 also corresponds to the second memory cell MC2.

Figure 2B:
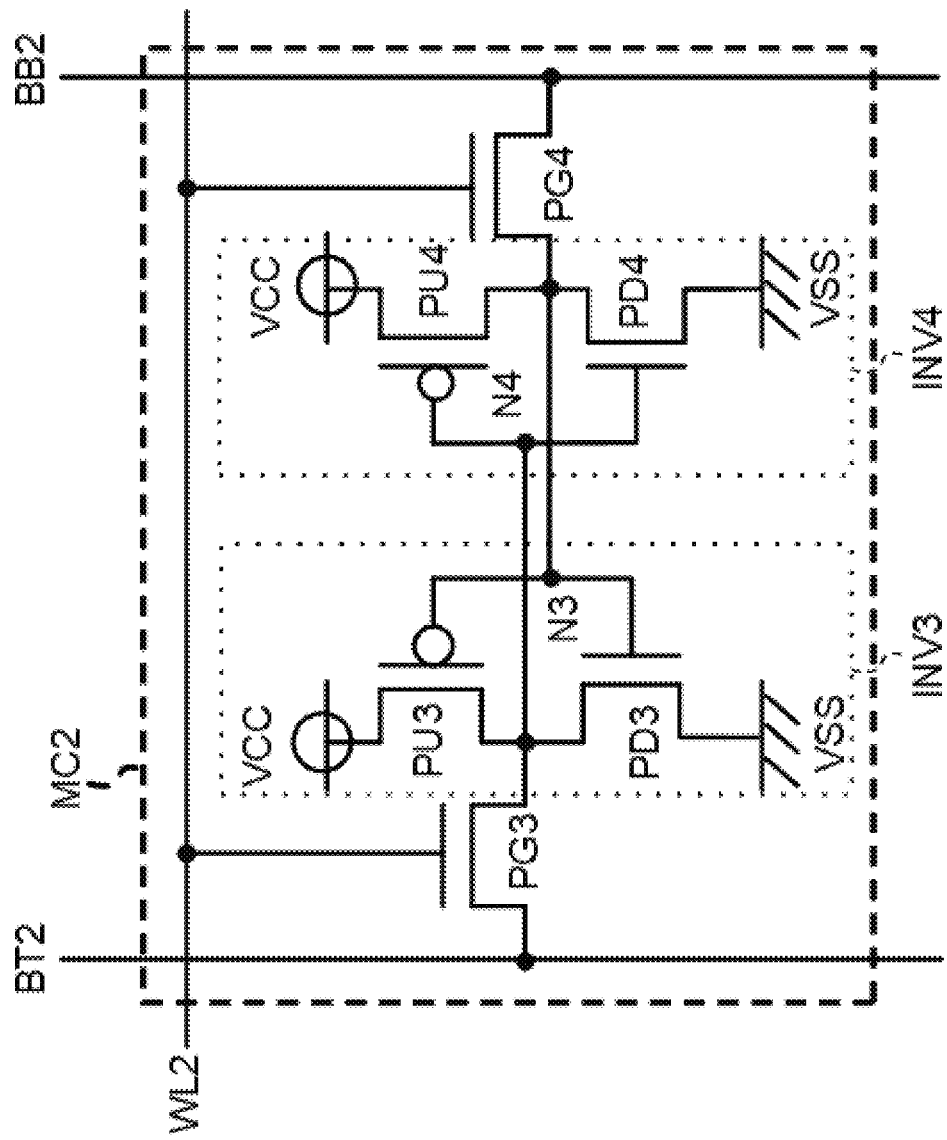
FIG. 2B is a circuit diagram of a second memory cell in the First Embodiment.

FIG. 2B shows a circuit diagram of the second memory cell MC2. As shown in the drawing 2B, the second memory cell MC2 includes a third inverter INV3 and a fourth inverter INV4.

As shown in the FIG. 2B, the third inverter INV3 has a third pull up transistor PU3 and a third pull down transistor PD3 which are formed between the first power supply VCC and the ground power supply VSS. As shown in the FIG. 2B, the third pull up transistor PU3 and the third pull down transistor PD3 are connected in series between the first power supply VCC and the ground power supply VSS.

On the other hand, the fourth inverter INV4 has the same configuration as the third inverter INV3. Specifically, the fourth inverter INV4 has a fourth pull up transistor PU4 and a fourth pull down transistor PD4 formed between the first power supply VCC and the ground power supply VSS, as shown in FIG. 2B. As shown in the FIG. 2B, the fourth pull up transistor PU4 and the fourth pull down transistor PD4 are connected in series between the first power supply VCC and the ground power supply VSS.

Here, as shown in the FIG. 2B, the third pull up transistor PU3 constituting the third inverter INV3 and the fourth pull up transistor PU4 constituting the fourth inverter INV4 are p-channel type field effect transistor. On the other hand, as shown in the FIG. 2B, the third pull down transistor PD3 constituting the third inverter INV3 and the fourth pull down transistor PD4 constituting the fourth inverter INV4 are n-channel type field effect transistor.

As shown in the FIG. 2B, the gate electrode of the third pull up transistor PU3 and the gate electrode of the third pull down transistor PD3 constituting the third inverter INV3 are electrically connected to the output portion of the fourth inverter INV4 via the third storage node (wiring, wiring pattern) N3. Here, the output portion of the fourth inverter INV4 corresponds to a node in which the drain of the fourth pull up transistor PU4 and the drain of the fourth pull down transistor PD4 are connected to each other in the FIG. 2B. A fourth pass gate transistor PG4 is also connected to the output portion of the fourth inverter INV4, as shown in FIG. 2B. The gate of the fourth pass gate transistor PG4 is connected to the second word line WL2. The drain or the source of the fourth pass gate transistor, which is opposite to the drain or source connected to the output portion of the fourth inverter INV4, is connected to the second bit line BB2.

On the other hand, as shown in the FIG. 2B, the respective gate electrodes of the fourth pull up transistor PU4 and the fourth pull down transistor PD4 constituting the fourth inverter INV4 are electrically connected to the output portion of the third inverter INV3 via the fourth storage node (wiring, wiring pattern) N4. Here, the output portion of the third inverter INV3 corresponds to a node in which the drain of the third pull up transistor PU3 and the drain of the third pull down transistor PD3 are connected to each other in the FIG. 2B. As shown in FIG. 2B, a third pass gate transistor PG3 is also connected to the output portion of the third inverter INV3. The gate of the third pass gate transistor PG3 is connected to the second word line WL2, and the drain or the source of the third word line pass gate transistor, which is opposite to drain or source of connected to the output portion of the third inverter INV3, is connected to the second bit line BT2.

Figure 3:
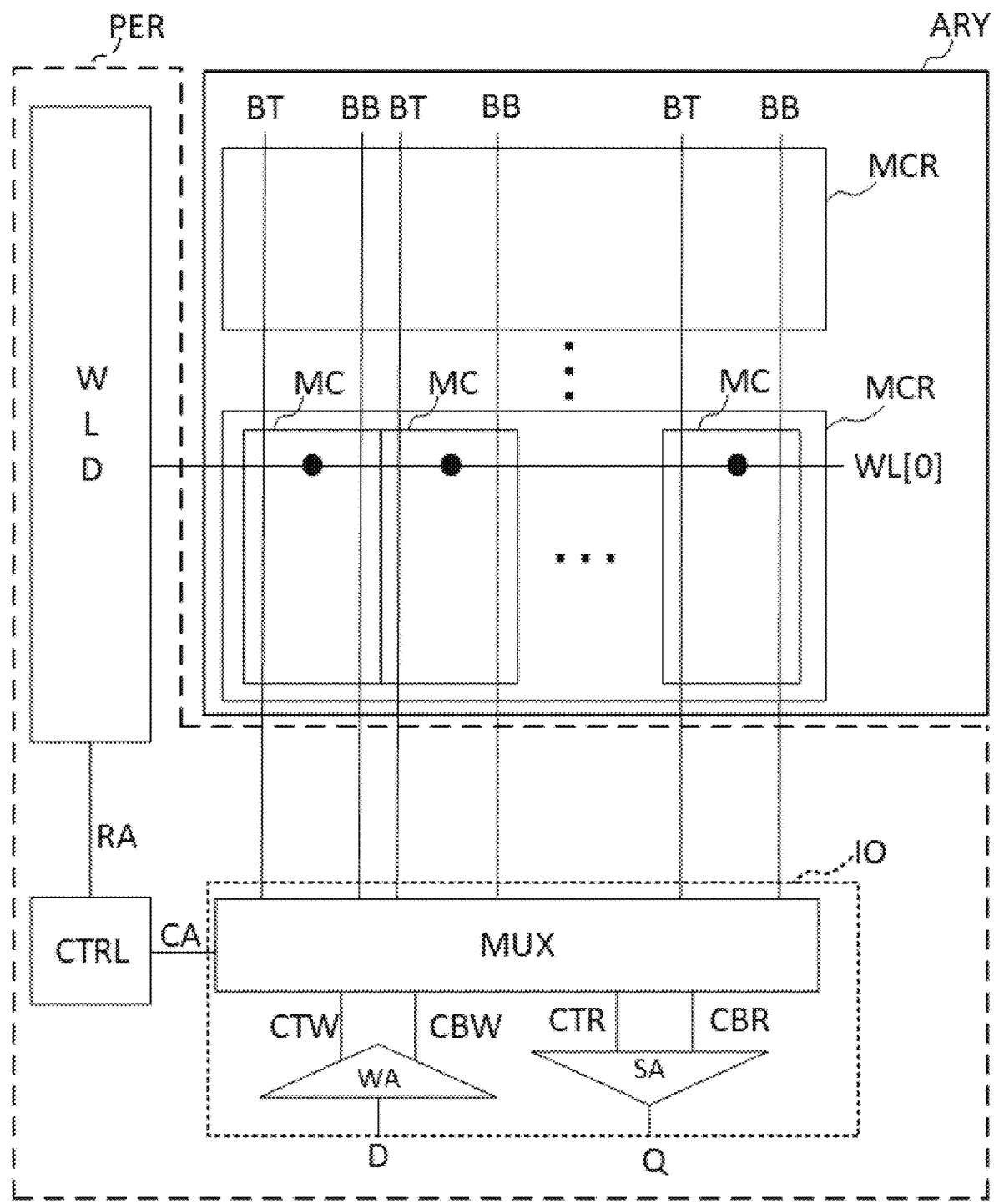
FIG. 3 is a block diagram showing the forms of the first memory circuit and the second memory circuit in the First Embodiment.

FIG. 3 is a block diagram showing an exemplary configuration of the first memory circuit 201 and the second memory circuit 301. The memory cell MC in the figure is the first memory cell MC1 in the case of the first memory circuit 201, and the second memory cell MC2 in the case of the second memory circuit 301. The pair of bit lines BT and BB are the first bit lines BT1 and BB1 in the case of the first memory circuit 201, and the second bit lines BT2 and BB2 in the case of the second memory circuit 301. The word line WL is the first word line WL1 in the case of the first memory circuit 201, and the word line WL is the second word line WL2 in the case of the second memory circuit 301.

The first memory circuit 201 and the second memory circuit 301 include memory array region ARY and peripheral circuit region PER in which a plurality of memory cells are arranged in rows and columns.

In the memory array region ARY, a plurality of memory cells MC are arranged in a matrix. Memory cells MC constitute memory cell rows MCR for each row. The memory cell row MCR includes n memory cells in one row, where n is a natural number. One word line WL is arranged for each memory cell row MCR and is connected to each memory cell MC included in the memory cell row MCR. In the memory cell MC, a pair of bit lines BT and BB are connected for each column.

The peripheral circuit region PER include word line drivers WLD, control circuit CTRL, and input/output circuit IO.

Row address RA is supplied from the control circuit CTRL to the word-line driver WLD. The word line driver WLD to which the column address CA is supplied from the control circuit CTRL to the column selection circuit MUX activate the word line selected in accordance with the row address RA supplied from the control circuit CTRL. An input/output circuit IO is provided for each of a plurality of memory cell columns. The input/output circuit IO includes a column selection circuit MUX, a write amplifier WA, and a sense amplifier SA. The column selection circuit MUX selects one of the plurality of memory cell columns in accordance with the column address CA supplied from the control circuit CTRL.

The write amplifier WA transmits writing signal to the column selection circuit MUX through a pair of common write bit lines CTW and CBW in accordance with the input data D. In response to the writing signal, the potentials of the bit lines BT and BB of the selected memory cell column are changed in a complementary manner, and the writing is performed.

The sense amplifier SA receives the potentials outputted to the bit lines BT and BB in accordance with the data of the selected memory cell MC through the pair of common reading bit lines CTR and CBR and detects and amplifies the potential difference between the pair of common reading bit lines CTR and CBR.

In present embodiment, the storage capacity of the second memory circuit 301 is smaller than the storage capacity of the first memory circuit 201. However, the storage capacity of the second memory circuit may be greater than or equal to the storage capacity of the first memory circuit. As will be described later, when the data of the first memory circuit 201 is saved in the second memory circuit 301, the storage capacity of the second memory circuit 301 is made smaller than the storage capacity of the first memory circuit 201, and the minimum data of the data stored in the first memory circuit 201 is saved in the second memory circuit 301, whereby the effect of the increase in area due to the second memory circuit 301 can be suppressed.

Semiconductor device 1 includes operation modes controlled by system controller 302. The operation mode includes a first mode (normal operation mode) and a second mode (standby mode). Specifically, in the first mode, reading or writing of data to the first memory cell MC1 of the first memory circuit 201 is performed. On the other hand, in the second mode, neither reading nor writing of data to the first memory cell MC1 of the first memory circuit 201 is performed. In the second mode (standby mode), the first power supply potential VCCp to the regulator 101 is cut off. Therefore, the second power supply potential VDDp is not supplied from the regulator 101 to the core region 2, and the data of the first memory cell MC1 included in the first memory circuit 201 is not held. On the other hand, since the first power supply potential VCCp continues to be supplied to the high withstand voltage region 3 even in the second mode, the data of the second memory cell MC2 included in the second memory circuit 301 continues to be held.

In the process of shifting from the first mode to the second mode, the second memory circuit 301 has a third mode in which reading or writing of data to the second memory cell MC2 is performed, and a fourth mode in which reading and writing of data to the second memory cell MC2 are not performed. Specifically, in the fourth mode, the first power supply potential VCCp is not supplied to the peripheral circuit region PER of the second memory cell MC2, while the first power supply potential VCCp is supplied to the second memory cell MC2. At this time, the ground potential VSSp is supplied to both the peripheral circuit region PER and the memory array region ARY of the second memory circuit 301. As a result, it is possible to suppress the power consumed by the peripheral circuit region of the second memory circuit 301 while holding the data of the second memory cell MC2. The second memory circuit 301 has the third mode and the fourth mode even after shifting to the second mode.

In the fourth mode of the second memory circuit 301, the ground potential may be supplied to the peripheral circuit region PER, while the ground potential ARVSSp higher than the ground potential VSSp and lower than the first power supply potential VCCp may be supplied to the memory array region ARY of the second memory circuit 301. In this case, in the case where the ground potential ARVSSp is supplied to the memory array region ARY of the second memory circuit 301, the leakage current in the memory array region ARY can be suppressed more than in the case where the ground potential VSSp is supplied to the memory array region ARY, and the power saving effect becomes larger.

Figure 4A:
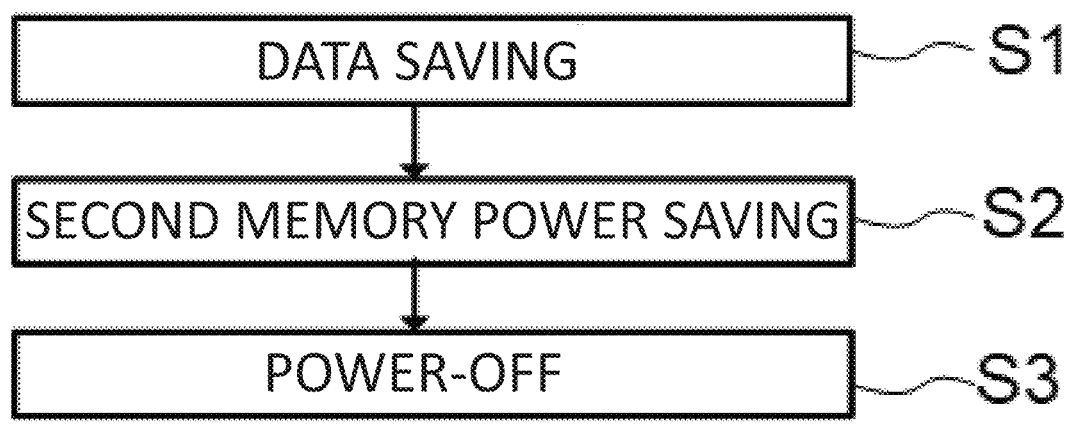
FIG. 4A is a flow chart showing the operation when shifting to the second mode in the First Embodiment.
Figure 4B:
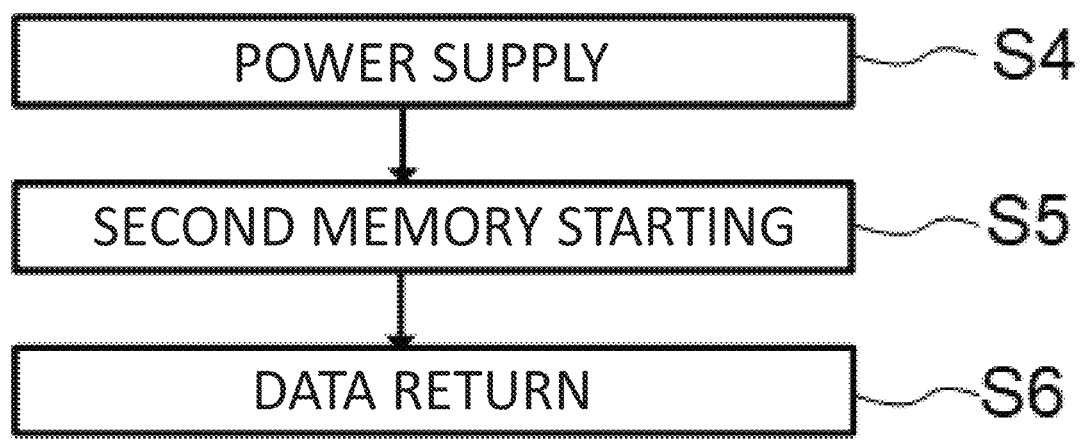
FIG. 4B is a flow chart showing the operation when returning from the second mode in the First Embodiment.

FIG. 4A is a diagram showing a flow in the case of shifting from the first mode to the second mode, and FIG. 4B is a diagram showing a flow in the case of returning from the second mode to the first mode.

As shown in the FIG. 4A, when the semiconductor device 1 shifts from the first mode to the second mode, the following steps are performed.

(Data saving step S1) First, data is read from the first memory cell MC1 included in the first memory circuit 201. At this time, the second power supply potential VDDp stepped down from the first power supply potential VCCp is supplied to the first memory circuit 201 through the regulator 101. Next, the read data is written into the register 202. Then, the data written to the register 202 is read, and the read data is written to the second memory cell MC2 included in the second memory circuit 301 through the level shifter 102.

(Second memory power saving step S2) Next, the supplying of the first power supply potential VCCp to the peripheral circuit region PER of the second memory circuit 301 is cut off, and the second memory circuit 301 shifts to the fourth mode. At this time, the first power supply potential VCCp continues to be supplied to the memory array region ARY of the second memory circuit 301. As a result, it is possible to suppress the power consumed by the peripheral circuit region PER of the second memory circuit 301 while holding the data in the second memory cell MC2 included in the memory array region ARY of the second memory circuit 301.

(Power-off step S3) Then, the operation mode signal RS is transmitted from the system controller 302 to the regulator 101, and the power to the regulator 101 is cut off. That is, the supplying of the first power supply potential VCCp to the regulator 101 is cut off, and the driving of the regulator 101 is stopped. As a result, the supplying of the second power supply potential VDDp to the first memory circuit 201 disposed in the core region 2 is cut off. That is, the first memory circuit 201 does not hold data. At this time, the first power supply potential VCCp continues to be directly supplied to the second memory circuit 301 without passing through the regulator 101.

Although not shown, the regulator 101 shown in FIG. 1 further includes a switch, and in the present embodiment, the system controller 302 controls on/off of the switch. Then, based on the operation mode signal RS transmitted from the system controller 302, the switch is switched from the on state to the off state, whereby the first power supply potential VCCp supplied to the regulator 101 is cut off. The switch may be provided outside the regulator 101. That is, the switch may be provided on the wiring (transmission path) through which the first power supply potential VCCp is transmitted, more specifically, between the regulator 101 and the branch point (node) of the wiring (transmission path) that branch toward the core region 2 and the high withstand voltage region 3, respectively.

In the present embodiment, the second memory circuit 301 shifts to the fourth mode in the second memory power saving step S2 and the power supply to the peripheral circuit region PER of the second memory circuit 301 is cut off, but the first power supply potential VCCp may be continuously supplied to the peripheral circuit region PER of the second memory circuit 301 even in the second mode without performing the second memory power saving step S2 (third mode). However, when it is desired to further suppress the power consumed by the semiconductor device 1, it is preferable to cut off the first power supply potential VCCp supplied to the peripheral circuit region PER of the second memory circuit 301 as in present embodiment.

As shown in the FIG. 4B, when the semiconductor device 1 returns from the second mode to the first mode, the following steps are performed.

(Power Supply Process S4) The system controller 302 transmits an operation mode signal RS to the regulator 101 and provides a first power supply potential VCCp to the regulator 101. That is, the regulator 101 is driven. As a result, the second power supply potential VDDp stepped down from the first power supply potential VCCp is supplied to the first memory circuit 201 disposed in the core region 2. That is, the first memory circuit 201 can hold data. At this time, the first power supply potential VCCp continues to be directly supplied to the second memory circuit 301 without passing through the regulator 101. Although not shown, the regulator 101 shown in FIG. 1 further includes a switch, and in the present embodiment, the system controller 302 controls on/off of the switch. The switch is switched from the off state to the on state based on the operation mode signal RS transmitted from the system controller 302, whereby the first power supply potential signal VCCp is supplied to the regulator 101. The switch may be provided outside the regulator 101, that is, on the wiring (transmission path) in which the first power supply potential VCCp is transmitted, more specifically, between a branch point branching into the core region 2 and the high voltage resistance region 3 and the regulator 101.

(Second memory starting step S5) Then, the first power supply potential VCCp is supplied to the peripheral circuit region PER of the second memory circuit 301, and the second memory circuit 301 enters the third mode. As a result, data can be read from the second memory cell MC2 included in the second memory circuit 301, and data can be written to the second memory cell MC2.

(Data Return Process S6) First, reading out the data of the second memory cell MC2 included in the second memory circuit 301. The read data is written into the register 202 through the level shifter 102. Next, the data written in the register 202 is read, and the read data is written in the first memory cell MC1 included in the first memory circuit 201.

When the second memory power saving step S2 is not performed and the first power supply potential VCCp is continuously supplied to the peripheral circuit region PER of the second memory circuit 301 even in the second mode, the second memory starting step S5 is not performed.

According to the above step, as described in the data saving process S1, the data stored in the first memory cell MC1 of the first memory circuit 201 is saved in the second memory circuit 301 prior to the transition to the second mode, and the data is saved in the first memory circuit 201 after the return from the second mode as described in the data return process S6.

The difference between the first power supply potential VCCp applied to the second memory cell MC2 and the ground potential VSSp is larger than the difference between the second power supply potential VDDp applied to the first memory cell MC1 and the ground potential VSSp. Therefore, the threshold voltage Vt2 used for each transistor included in the second memory cell MC2 is larger than the threshold voltage Vt1 used for each transistor included in the first memory cell MC1.

Figure 16A:
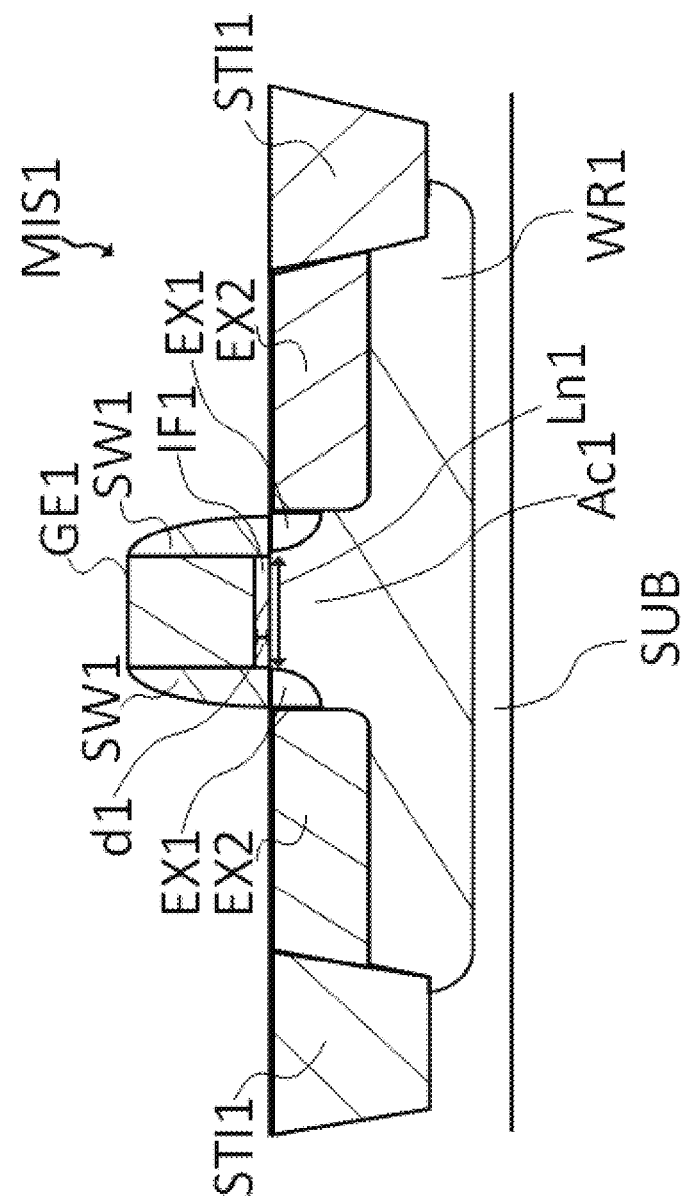
FIG. 16A is a cross-sectional view of a first field effect transistor in the First Embodiment.

FIG. 16A shows the cross-sectional view of the first field effect transistor MIS1 constituting each of the first pull up transistor PU1, the second pull up transistor PU2, the first pull down transistor PD1, the second pull down transistor PD2, the first pass gate transistor PG1, and the second pass gate transistor PG2 included in the first memory cell MC1.

An isolation region STI1 is formed in the semiconductor substrate SUB. The active region Ac1 is partitioned by the device isolation region STI1. That is, the active region Ac1 is a region of the semiconductor substrate SUB exposed from the device isolation region STI1. A well region WR1 is formed in the semiconductor substrate SUB. For an n-channel field effect transistor, well region WR1 is a p-well PW (see FIG. 5A) that contains a p-type impurity (e.g., boron). For a p-channel field effect transistor, well region WR1 is an n-well NW (see FIG. 5A) that contains n-type impurities (e.g., phosphorus, arsenic, etc.).

An insulating film (gate insulating film) IF1 is formed on the main surface of the active region Ac1. As the insulating film IF1, for example, a silicon oxide film or the like can be used. Gate electrodes GE1 are formed on the insulating film IF1. As the gate electrode GE1, for example, a polysilicon film can be used. A low concentration impurity region EX1 is formed in the well region WR1 on both sides of the gate electrode GE1. Sidewalls SW1 are formed on both side walls of the gate electrode GE1. The sidewall SW1 is made of, for example, a silicon nitride film.

A high concentration impurity region EX2 is formed in the well region WR1 on both sides of the composite of the gate electrode GE1 and the sidewall SW1. The high concentration impurity region EX2 has a higher impurity concentration and is formed deeper than the low concentration impurity region EX1. The low concentration impurity region EX1 and the high concentration impurity region EX2 constitute a source or a drain.

Figure 16B:
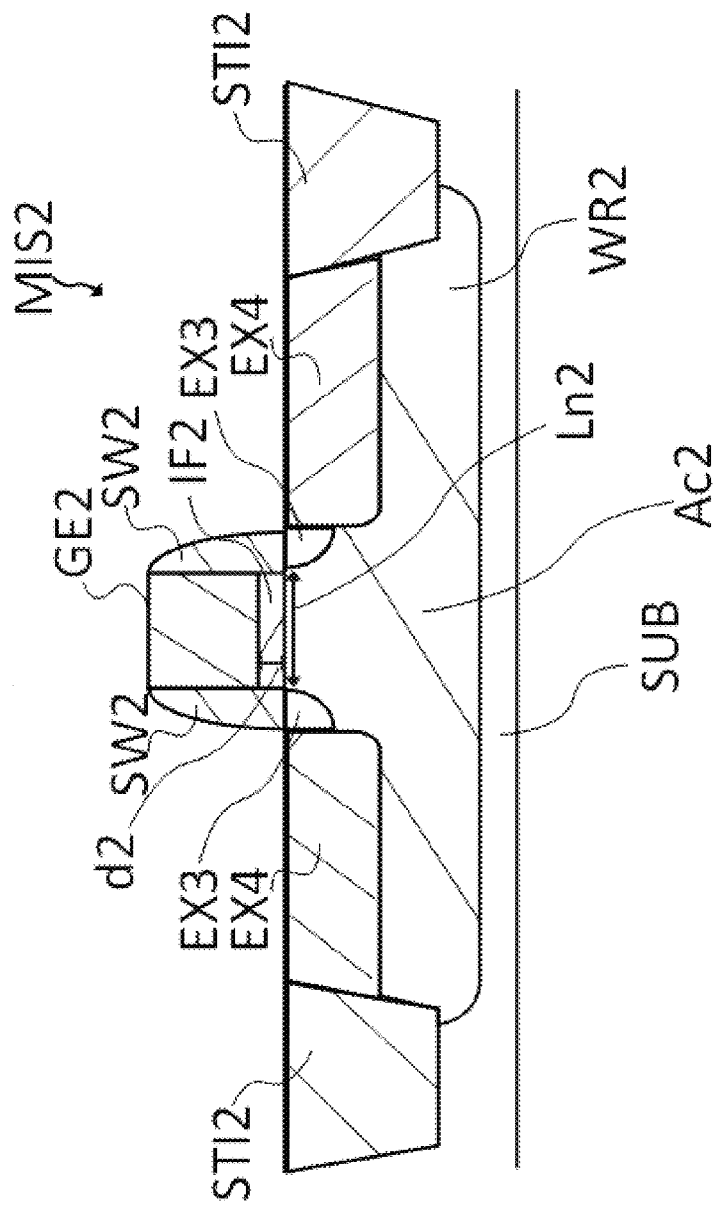
FIG. 16B is a cross-sectional view of the second field effect transistor in the First Embodiment.

FIG. 16B shows the cross-sectional view of the second field effect transistor MIS2 constituting each of the third pull up transistor PU3, the fourth pull up transistor PU4, the third pull down transistor PD3, the fourth pull down transistor PD4, the third pass gate transistor PG3, and the fourth pass gate transistor PG4 included in the second memory cell MC2.

An isolation region STI2 is formed in the semiconductor substrate SUB. The active region Ac2 is partitioned by the device isolation region STI2. A well region WR2 is formed in the semiconductor substrate SUB. For an n-channel field effect transistor, well region WR2 is a p-well PW (see FIG. 5B) that contains a p-type impurity (e.g., boron). For a p-channel field effect transistor, well region WR2 is an n-well NW (see FIG. 5B) that contains n-type impurities (e.g., phosphorus, arsenic, etc.).

An insulating film (gate insulating film) IF2 is formed on the main surface of the active region Ac2. As the insulating film IF2, for example, a silicon oxide film or the like can be used. Gate electrode GE2 is formed on the insulating film IF2. As the gate electrode GE2, for example, a polysilicon film can be used. A low concentration impurity region EX3 is formed in the well region WR2 on both sides of the gate electrode GE2. Sidewalls SW2 are formed on both side walls of the gate electrode GE2. The sidewall SW2 is made of, for example, a silicon nitride film.

A high concentration impurity region EX4 is formed in the well region WR2 on both sides of the composite of the gate electrode G2 and the sidewall SW2. The high concentration impurity region EX4 has a higher impurity concentration and is formed deeper than the low concentration impurity region EX3. The low concentration impurity region EX3 and the high concentration impurity region EX4 constitute the source or the drain.

As shown in FIGS. 16A and 16B, the gate length Ln1 of the first field effect transistor MIS1 is a distance between two high-concentration impurity regions EX2. As shown in FIG. 16B, the gate length of the second field effect transistor MIS2 is the distance Ln2 between the two high concentration impurity region EX2. As shown in FIGS. 16A and 16B, the gate length Ln2 of the second field effect transistor MIS2 is longer than the gate length Ln1 of the first field effect transistor MIS1. Thereby, the threshold of the second field effect transistor MIS2 can be made larger than the threshold of the first field effect transistor MIS1.

Also, the thickness d1 of the insulating film IF1 of the first field effect transistor MIS1 is, for example, 1 nm to 4 nm. On the other hand, the thickness d2 of the insulating film IF2 of the second field effect transistor MIS2 is, for example, 4 nm to 7 nm. That is, as shown in FIGS. 16A and 16B, respectively, the thickness d2 of the second field effect transistor insulating film IF2 is thicker than the thickness d1 of the insulating film IF1 of the first field effect transistor MIS1. Thereby, the threshold of the second field effect transistor MIS2 can be made larger than the threshold of the first field effect transistor MIS1.

In the present embodiment, as shown in FIGS. 16A and 16B, gate length Ln2 and the thicknesses d2 of the gate insulating film IF2 of the second field effect transistor MIS2 are described as being greater than the gate length Ln1 and the thicknesses d1 of the gate insulating film IF1 of the first field effect transistor MIS1, respectively. However, although the gate length Ln2 of the second field effect transistor MIS2 is greater than the gate length Ln1 of the first field effect transistor MIS1, the thickness d2 of the gate insulating film IF2 of the second field effect transistor MIS2 may be less than or equal to the thickness d1 of the gate insulating film IF1 of the first field effect transistor MIS1. Further, although the thickness d2 of the second field effect transistor MIS2 insulating film IF2 is thicker than the thickness d1 of the insulating film IF1 of the first field effect transistor MIS1, the gate length Ln2 of the second field effect transistor may be less than or equal to the gate length Ln1 of the first field effect transistor. However, from the viewpoint of increasing the threshold of the second field effect transistor MIS2, it is preferable that both the gate length Ln2 of the second field effect transistor MIS2 and the thickness d2 of the gate insulating film IF2 are larger than the gate length Ln1 of the first field effect transistor MIS1 and the thickness d1 of the gate insulating film FI1, respectively, as in present embodiment. Thereby, the threshold of the second field effect transistor MIS2 can be made larger than the threshold of the first field effect transistor MIS1.

Figure 5A:
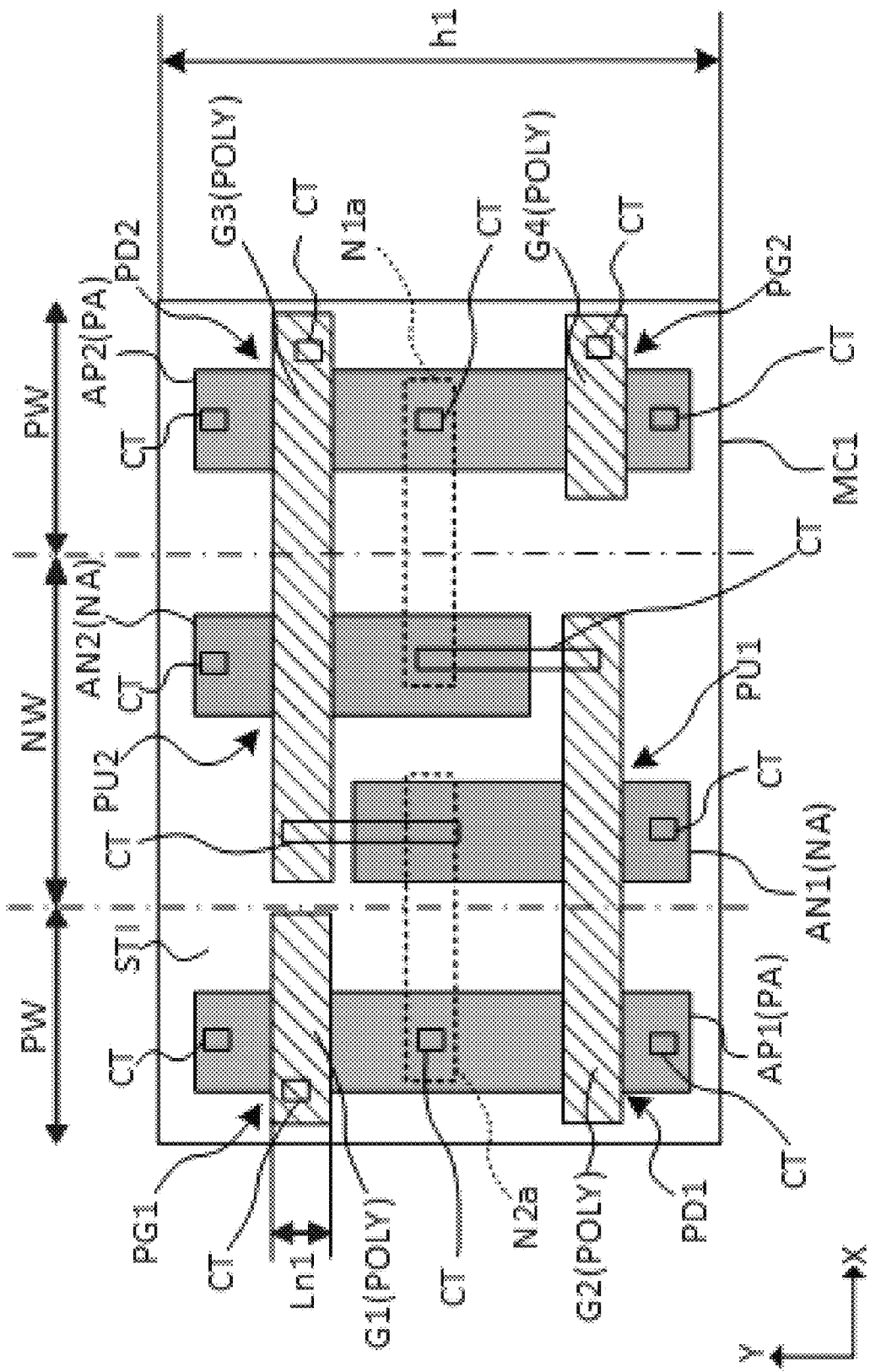
FIG. 5A is a plan layout diagram of the first memory cell in the First Embodiment.

FIG. 5A shows a layout diagram of the first memory cell MC1. In the FIG. 5A, an active region Ac, a poly-silicon POLY, contacts CT, and a first metal wiring layer M1 constituting storage node are shown. As shown in FIG. 5A, the gate length Ln1 of the first field effect transistor MIS1 is the length of the first to fourth gate wiring (gate electrodes) G1, G2, G3, and G4 along the Y-direction.

The gate length Ln1 of the respective field effect transistor constituting the first memory cell MC1 has the same length. The gate length Ln1 indicates a distance between the diffusion layer forming the source region and the diffusion layer forming the drain region of each field effect transistor.

Figure 5B:
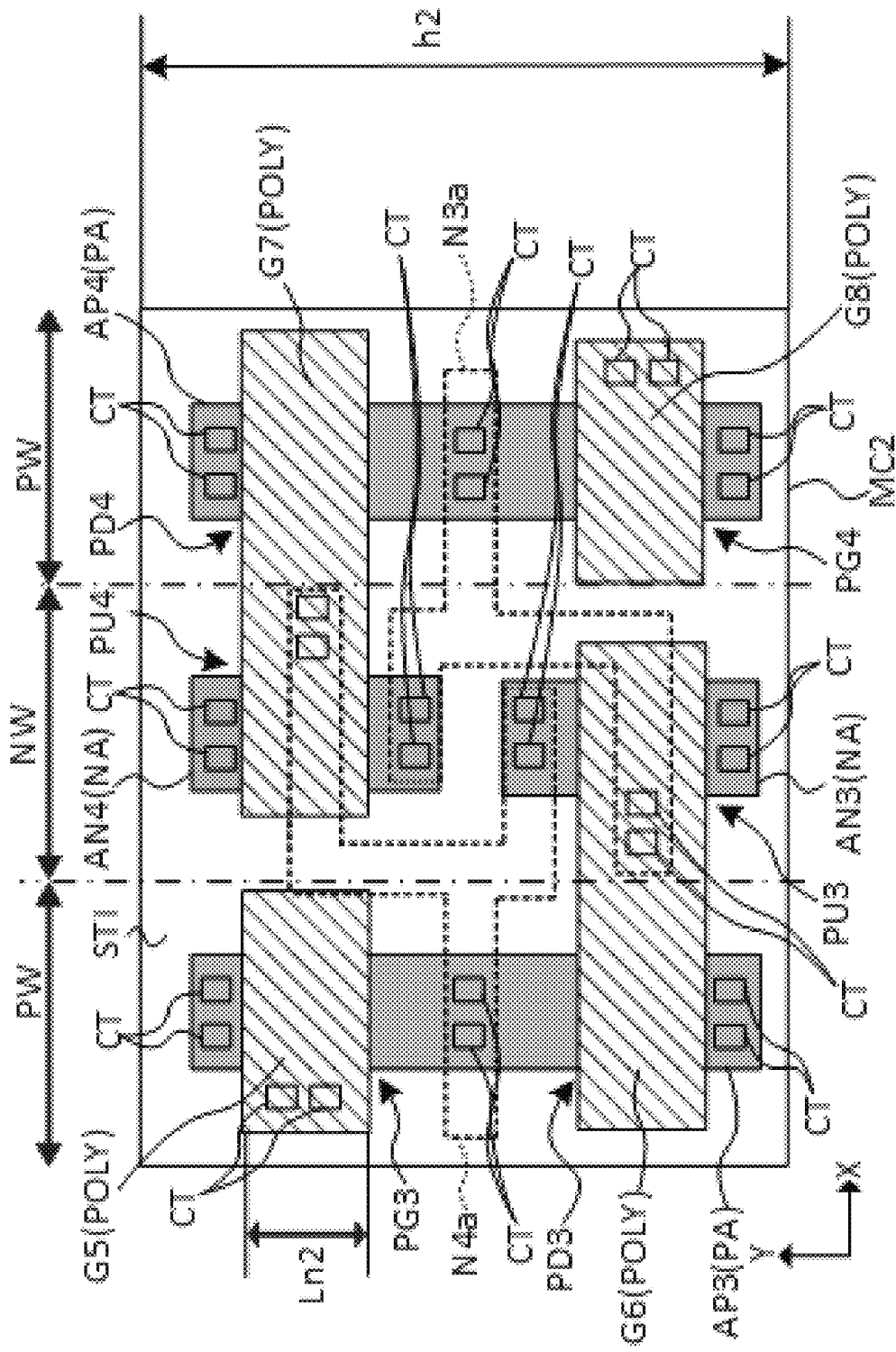
FIG. 5B is a plan layout diagram of the second memory cell in the First Embodiment.

FIG. 5B shows a layout diagram of the second memory cell MC2. In the FIG. 5B, an active region Ac, a poly-silicon POLY, contacts CT, and a first metal wiring layer M1 constituting storage node are shown. As shown in the FIG. 5B, the gate length Ln2 of the second field effect transistor MIS2 is the length of the fifth to eighth gate wirings (gate electrodes) G5, G6, G7, and G8 along the Y-direction. As shown in FIGS. 5A and 5B, the gate length Ln2 is longer than the gate length Ln1.

In FIGS. 5A and 5B, the first memory cell MC1 and the second memory cell MC2 have an n-well NW, a p-well PW, a p-type active region PA (first p-type active region AP1, second p-type active region AP2), an n-type active region NA (first n-type active region AN1, second n-type active region AN2), first to fourth gate wirings G1 to G4, and contacts CT.

The n-well NW is formed by ion-implanting an n-type impurity into the semiconductor substrate SUB. The p-well PW is formed by ion-implanting a p-type impurity into the semiconductor substrate SUB. The p-type active region PA is a region in which a p-well PW is formed. The n-type active region NA is a region in which an n-well NW is formed. First to eighth gate wirings G1 to G8 are arranged on the active region Ac via an insulating film.

Hereinafter, the extending directions of the first word line WL1 and the second word line WL2 are defined as the X-direction, and the extending directions of the pair of first bit lines BT1 and BB1 and the pair of second bit lines BT2 and BB2 are defined as the Y-direction.

The first memory cell MC1 includes a first p-type active region AP1, a first p-type active region AN1, second n-type active region AN2, and a second p-type active region AP2. These active regions extend in the Y-direction and are arranged in order in the X-direction.

The second memory cell MC2 includes a third p-type active region AP3, a third n-type active region AN3, a fourth p-type active region AP4, and a fourth n-type active region AN4. These active regions extend in the Y-direction. The third n-type active region AN3 and the fourth n-type active region AN4 are disposed between the third p-type active region AP3 and the fourth p-type active region A4 in the X-direction. The fourth n-type active region AN4 is arranged on an extension line of the third n-type active region AN3 in the Y-direction.

As shown in the FIG. 5A, the first memory cell MC1 has first to fourth gate wirings G1, G2, G3, and G4 extending in the X-direction.

The first pull down transistor PD1 includes a part of the second gate wiring G2 and a part of the first p-type active region AP1. The first pull up transistor PU1 includes a part of the second gate wiring G2 and a part of the first n-type active region AN1. The first pass gate transistor PG1 includes a part of the first gate wiring G1 and a part of the first p-type active region AP1. The second pull down transistor PD2 includes a part of the third gate wiring G3 and a part of the second p-type active region AP2. The second pull up transistor PU2 includes a part of the third gate wiring G3 and a part of the second n-type active region AN2. The second pass gate transistor PG2 includes a part of the fourth gate wiring G4 and a part of the second p-type active region AN2.

The second storage node N2 shown in the FIG. 2A is composed of the second storage node wiring N2a arranged in the first metal wiring layer M1. The second storage node wiring N2a is electrically connected to one of the source or the drain of the first pass gate transistor PG1, the drain of the first pull up transistor PU1, the gate of the second pull up transistor PU2, and the gate of the second pull down transistor PD2 through the contact CT.

The first storage node N1 shown in the FIG. 2A is composed of the first storage node wiring N1a arranged in the first metal wiring layer M1. The first storage node wiring N1a is electrically connected to one of the source or the drain of the second pass gate transistor PG2, the drain of the second pull down transistor PD2, the gate of the first pull up transistor PU1, and the gate of the first pull down transistor PD1 through the contact CT.

As shown in the FIG. 5B, the second memory cell MC2 has fifth to eighth gate wirings G5, G6, G7, and G8 extending in the X-direction.

The third pull down transistor PD3 includes a part of the sixth gate wiring G6 and a part of the first p-type active region AP1. The third pull up transistor PU3 includes a part of the sixth gate wiring G6 and a part of the first n-type active region AN1. The third pass gate transistor PG3 includes a part of the fifth gate wiring G5 and a part of the first p-type active region AP1. The fourth pull down transistor PD4 includes a part of the seventh gate wiring G7 and a part of the second p-type active region AP2. The fourth pull up transistor PU4 includes a part of the seventh gate wiring G7 and a part of the second n-type active region AN2. The fourth pass gate transistor PG4 includes a part of the eighth gate wiring G8 and a part of the second p-type active region AN2.

The fourth storage node N4 shown in the FIG. 2B is composed of a fourth storage node wiring N4 arranged in the first metal wiring layer. The fourth storage node wiring N4a is electrically connected to one of the source or the drain of the third pass gate transistor PG3, the drain of the third pull up transistor PU3, the gate of the fourth pull up transistor PU4, and the gate of the fourth pull down transistor PD4 through the contact CT.

The third storage node N3 shown in the FIG. 2B is composed of a third storage node wiring N3a arranged in the first metal wiring layer. The third storage node wiring N3a is electrically connected to one of the source or the drain of the fourth pass gate transistor PG4, the drain of the fourth pull down transistor PD4, the gate of the third pull up transistor PU3, and the gate of the third pull down transistor PD3 through the contact CT.

As shown in FIGS. 5A and 5B, the length h2 in the Y-direction of the second memory cell MC2 is longer than the length h1 in the Y-direction of the first memory cell MC1. Note that the length h1 of the first memory cell MC1 and the length h2 of the second memory cell MC2 refer to the length in the Y-direction for the smallest region that is line-symmetric or point-symmetric in plan view when a plurality of first memory cells MC1 or second memory cells MC2 are repeatedly arranged in a matrix.

FIG. 6 shows the planar layout of the upper-layer wirings of the second memory cell MC2 of the present embodiment. FIG. 6 shows a first metal wiring layer M1, a first via V1, and a second metal wiring layer M2.

In the first metal wiring layer M1, a third storage node wiring N3a, a fourth storage node wiring N4a, a first layer first wiring M1a, a first layer second wiring M1b, a first layer third wiring M1c, a first layer fourth wiring M1d, a first layer fifth wiring M1e, a first layer sixth wiring M1f, a first layer seventh wiring M1g, and a first layer eighth wiring M1h are arranged.

In the second metal wiring layer M2, a second layer first wiring M2a, a second layer second wiring M2b, a second layer third wiring M2c, a second layer fourth wiring M2d, a second layer fifth wiring M2e, a second layer sixth wiring M2f, and a second layer seventh wiring M2g are arranged in order in the X-direction. The second layer first wiring M2a, the second layer second wiring M2b, the second layer third wiring M2c, the second layer fourth wiring M2d, the second layer fifth wiring M2e, the second layer sixth wiring M2f, and the second layer seventh wiring M2g all extend in the Y-direction.

The first layer first wiring M1a is electrically connected to a gate (fifth gate wiring G5) of the third pass gate transistor PG3 shown in the FIG. 5B through a contact CT. The first layer first wiring M1a is electrically connected to the second layer first wiring M2a through the first via V1. The second layer first wiring M2a is electrically connected to the second word line WL2 formed of the third layer second wiring through a second via described later.

The first layer second wiring M1b is electrically connected to the other of the source or drain of the third pass gate transistor PG3 shown in the FIG. 5B through the contact CT. The first layer second wiring M1b is electrically connected to the second layer third wiring M2c through the first via V1. The second layer third wiring M2c constitutes a second bit line BT2.

The first layer third wiring M1c is electrically connected to the source of the third pull down transistor PD3 shown in the FIG. 5B via the contact CT. The first layer third wiring M1c is electrically connected to the second layer second wiring M2b through the first via V1. The second layer second wiring M2b is connected to the ground power supply VSS through the second via and the third layer first wiring described below, and a ground potential VSSp is provided.

The first layer fourth wiring M1d is electrically connected to the source of the fourth pull up transistor PU4 shown in the FIG. 5B through the contact CT. The first layer fourth wiring M1d is electrically connected to the second layer fourth wiring M2d through the first via V1. The second layer fourth wiring M2d is connected to the first power supply VCC and is supplied with the first power supply potential VCCp.

The first layer fifth wire M1e is electrically connected to the source of the third pull up transistor PU3 shown in the FIG. 5B through the contact CT. The first layer fifth wiring M1e is electrically connected to the second layer fourth wiring M2d through the first via V1.

The first layer sixth wiring M1f is electrically connected to the source of the fourth pull down transistor PD4 shown in the FIG. 5B through the contact CT. The first layer sixth wiring M1f is electrically connected to the second layer sixth wiring M2f through the first via V1. The second layer sixth wiring M2f is connected to the ground power supply VSS through the second via and the third layer first wiring, which will be described later, to provide a ground potential VSSp.

The first layer seventh wiring M1g is electrically connected to the other of the source or drain of the fourth pass gate transistor PG4 shown in the FIG. 5B through the contact CT. The first layer seventh wiring M1g is electrically connected to the second layer fifth wiring M2e through the first via V1. The second layer fifth wire M2e constitutes a second bit line BB2.

The first layer eighth wiring M1h is electrically connected to the gate (eighth gate wiring G8) of the fourth pass gate transistor PG4 shown in the FIG. 5B through the contact CT. The first layer eighth wiring M1h is electrically connected to the second layer seventh wiring M2g through the first via V1. The second layer seventh wiring M2g is electrically connected to the second word line WL2 formed of the third layer second wiring through a second via described later.

Figure 7:
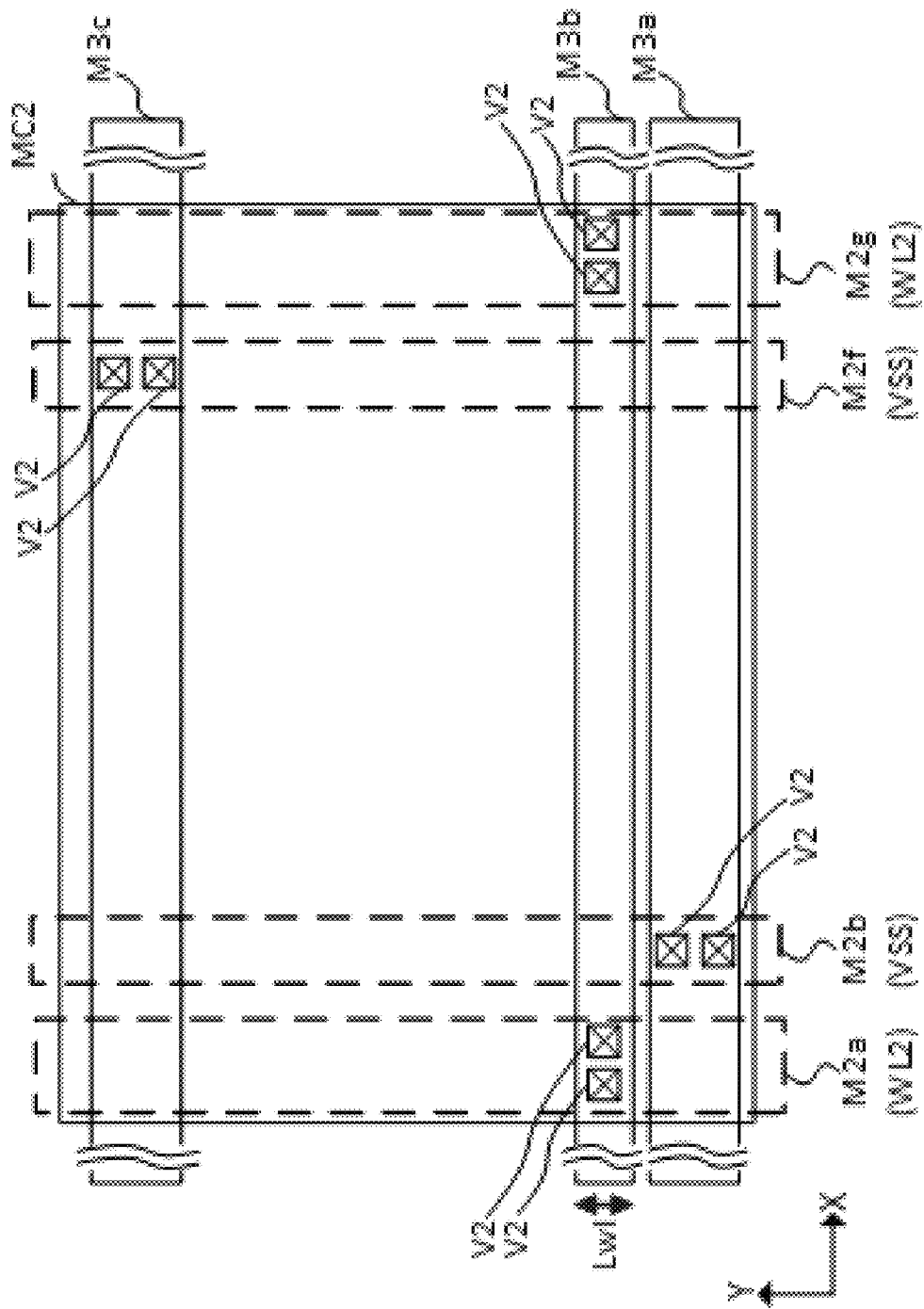
FIG. 7 is a plan layout diagram of the second metal wiring layer and the third metal wiring layer in the upper layer of the second memory cell in the First Embodiment.

FIG. 7 shows the planar layout of the upper-layer wirings of the second memory cell MC2 of the present embodiment. FIG. 7 shows the second metal wiring layer M2, the second via V2, and the third metal wiring layer M3.

In the third metal wiring layer M3, a third layer first wiring M3a, a third layer second wiring M3b, and a third layer third wiring M3c are arranged in this order in the Y-direction. The third layer first wiring M3a, the third layer second wiring M3b, and the third layer third wiring M3c all extend in the X-direction.

The third layer first wiring M3a is electrically connected to the second layer second wiring M2b through the second via V2. third layer first wiring M3a is connected to the ground power supply VSS and provides a ground potential VSSp.

The third layer second wiring M3b is electrically connected to the second layer first wiring M2a and the second layer seventh wiring M2g through the second via V2. The second word line WL2 is formed of a third layer second wiring M3b.

The third layer third wiring M3c is electrically connected to the second layer sixth wiring M2f through the second via V2. The third layer third wiring M3c is connected to the ground power supply VSS to provide a ground potential VSSp.

In present embodiment, the gate length Ln2 of the transistor constituting the second memory cell MC2 is larger than the width Lw1 of the third layer second wiring M3b. However, the gate length Ln of the transistor constituting the second memory cell MC2 may be equal to or smaller than the width Lw1 of the third layer second wiring M3b. However, from the viewpoint of reducing the resistivity of the third layer second wiring M3b, it is preferable that the gate length Ln2 of the transistor constituting the second memory cell MC2 is larger than the width Lw1 of the third layer second wiring M3b.

Figure 13:
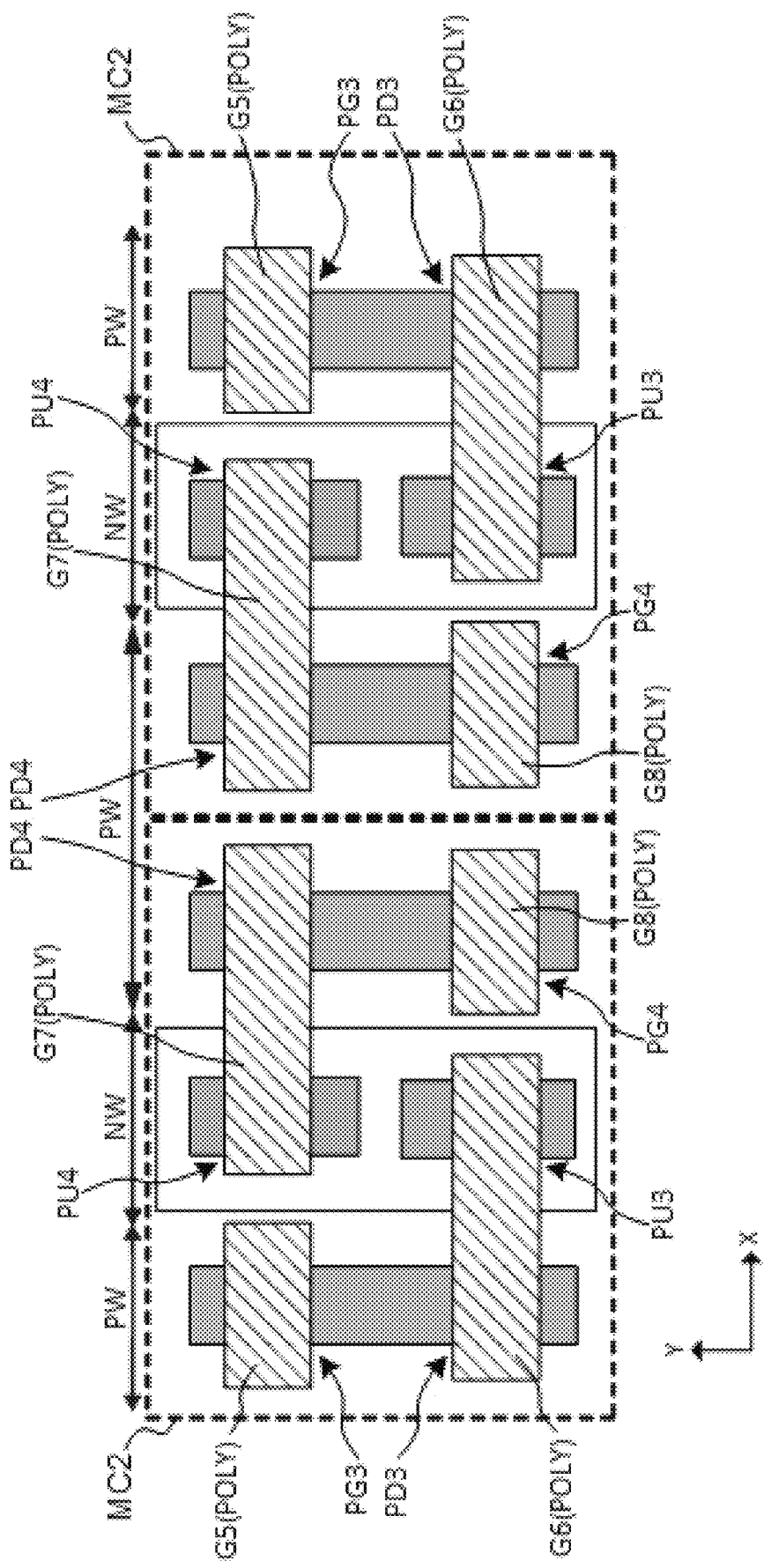
FIG. 13 is a plan layout diagram of adjacent memory cells in the First Embodiment.

FIG. 13 shows an example of planar layout of the second memory cells MC2 adjacent to each other in the second memory circuit 301. The eighth gate wirings G8 constituting the gates of the fourth pass gate transistor PG4 are separated from each other. As a result, the capacitance of the gate electrode of the fourth pass gate transistor PG4 can be reduced, and the operation of the gate electrode can be speeded up. In particular, since the second memory cell MC2 has higher operating voltage than the first memory cell MC1, the capacitance is greatly reduced. When it is not necessary to reduce the capacitance of the gate electrode of the fourth pass gate transistor PG4, the gate electrode of the fourth pass gate transistor PG4 of the adjacent second memory cell MC2 may be formed of an integral gate wire without being separated from each other.

According to the semiconductor device of the present embodiment, since the second power supply potential VDDp is supplied to the first memory circuit 201 through the regulator 101, and the first power supply potential VCCp is supplied to the second memory circuit 301 without the regulator, the driving of the regulator 101 is stopped while the data is held in the second memory circuit 301 in the second mode, whereby the power consumed by the regulator 101 can be suppressed.

Second Embodiment

FIG. 8A is a plan layout diagram of the first memory cell in the Second Embodiment. FIG. 8B is a plan layout diagram of the second memory cell in the Second Embodiment.

In the Second Embodiment, as shown in FIG. 8A, the gate length Lp1 of the p-channel type field effect transistor of the first memory cell MC1 is different in length from the gate length Ln1 of the n-channel type field effect transistor of the first memory cell MC1. Further, as shown in FIG. 8B, the gate length Lp2 of the p-channel field effect transistor of the second memory cell MC2 is of a length different from the gate length Ln2 of the n-channel field effect transistor of the second memory cell MC2. The rest of the configuration is the same as that of the previous First Embodiment, and therefore the explanation thereof is omitted.

In the first memory cell MC1, the gate length Ln1 of the first pass gate transistor PG1, the first pull down transistor PD1, the second pass gate transistor PG2, and the second pull down transistor PD2, which are n-channel type field effect transistor, is a distance between the source of the n-channel type field effect transistor and the drain of the n-channel type field effect transistor. The gate length Lp1 of the first pull up transistor PU1 and the second pull up transistor PU2, which are the p-channel type field effect transistor, is a distance between the source of the p-channel type field effect transistor and the drain of the p-channel type field effect transistor, and has a length differing from that of the gate length Ln1.

In the second memory cell MC2, the gate length Ln2 of the third pass gate transistor PG3, the third pull down transistor PD3, the fourth pass gate transistor PG4, and the fourth pull down transistor PD4, which are the n-channel type field effect transistor, has a length different from the gate length Lp2 of the third pull up transistor PU3 and the fourth pull up transistor PU4, which are the p-channel type field effect transistor.

In the present embodiment, as shown in FIGS. 8A and 8B, since the gate length Ln2 is longer than the gate length Ln1 and the gate length Lp2 is longer than the gate length Lp1, when the driving capability of the n-channel field effect transistor is smaller than that of the p-channel field effect transistor, the on-current of the n-channel field effect transistor can be increased.

Third Embodiment

The present embodiment utilizes the fact that the length h2 in the Y-direction of the second memory cell is larger than the length h1 in the Y-direction of the first memory cell in the First Embodiment, thereby increasing the word line to the region above the memory cell. That is, a plurality of word lines are provided for each row of the second memory cells. The rest of the configuration is the same as that of the previous First Embodiment, and therefore the explanation thereof is omitted.

Figure 9:
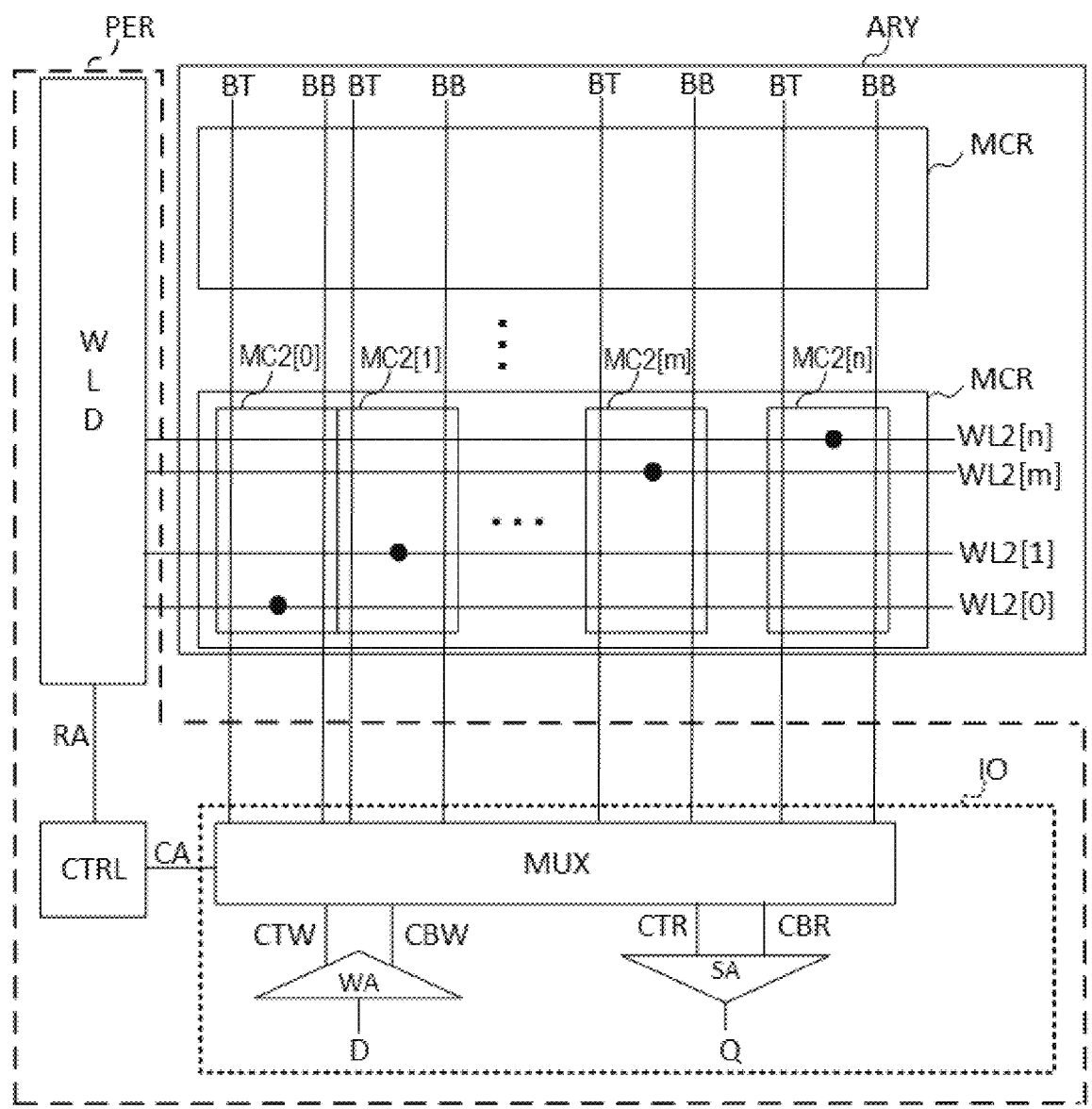
FIG. 9 is a diagram of a second memory circuit in a Third Embodiment.

FIG. 9 shows a block diagram of the second memory circuit 301 in the present embodiment. In present embodiment, a plurality of second word lines are provided for each memory cell row MCR. Each of the plurality of second word lines is provided corresponding to each memory cell column.

The memory cell row MCR includes n second memory cells MC2 in one row, where n is a natural number. The second memory cells MC2 are arranged in the order of 0-th column, m-th column (m is a natural number greater than or equal to 1 and less than n), and n-th column from the nearest word driver. Denoting the second memory cell MC2 in the m-th column by MC2[m], the m-th second word line WL2[m] is connected to the second memory cell MC2[m] in the m-th column. For each memory cell row MCR, n word lines are arranged in parallel in the X-direction.

Figure 10:
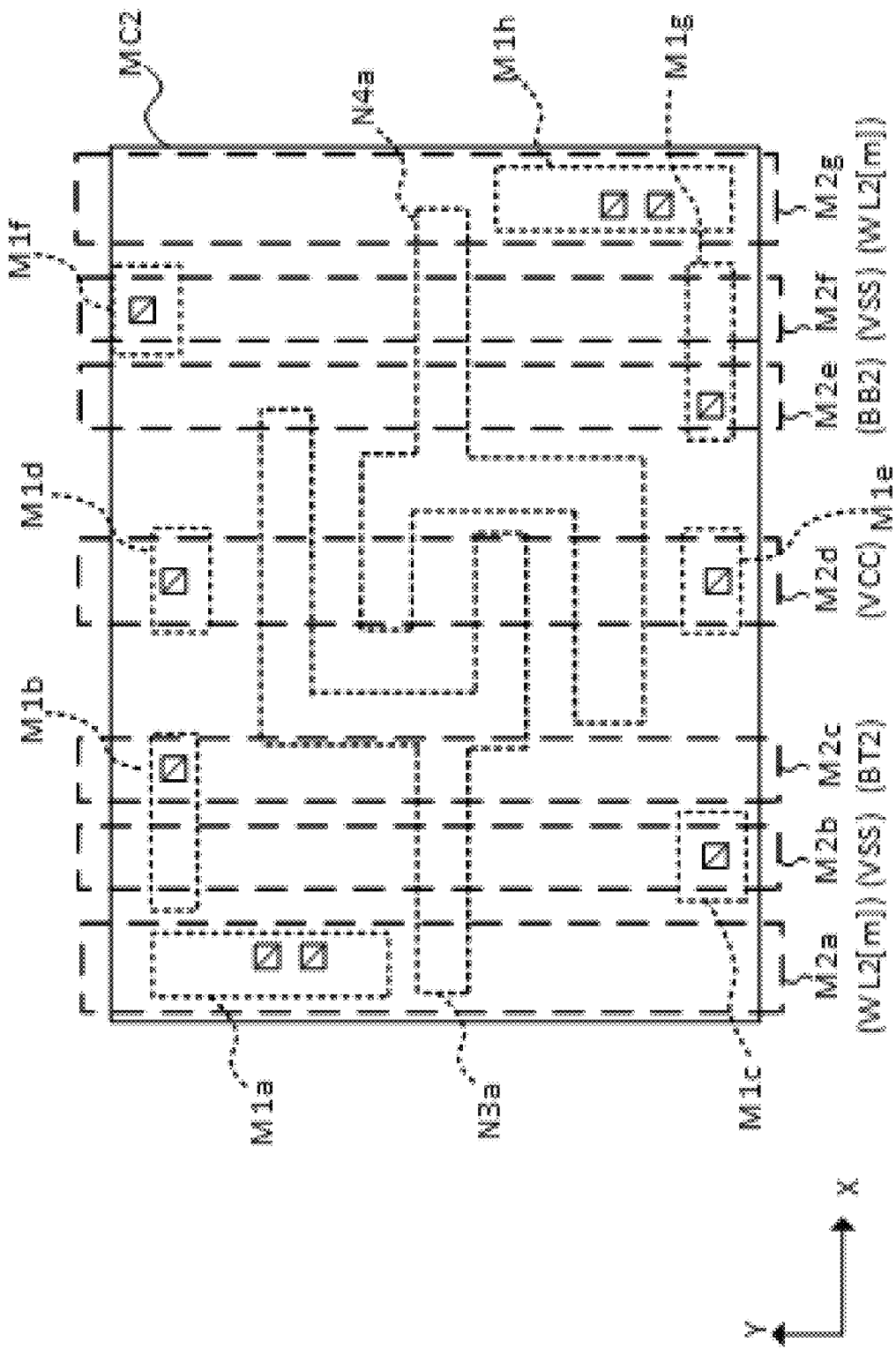
FIG. 10 is a plan layout diagram of the first metal wiring layer and the second metal wiring layer in the upper layer of the second memory cell in the Third Embodiment.
Figure 11:
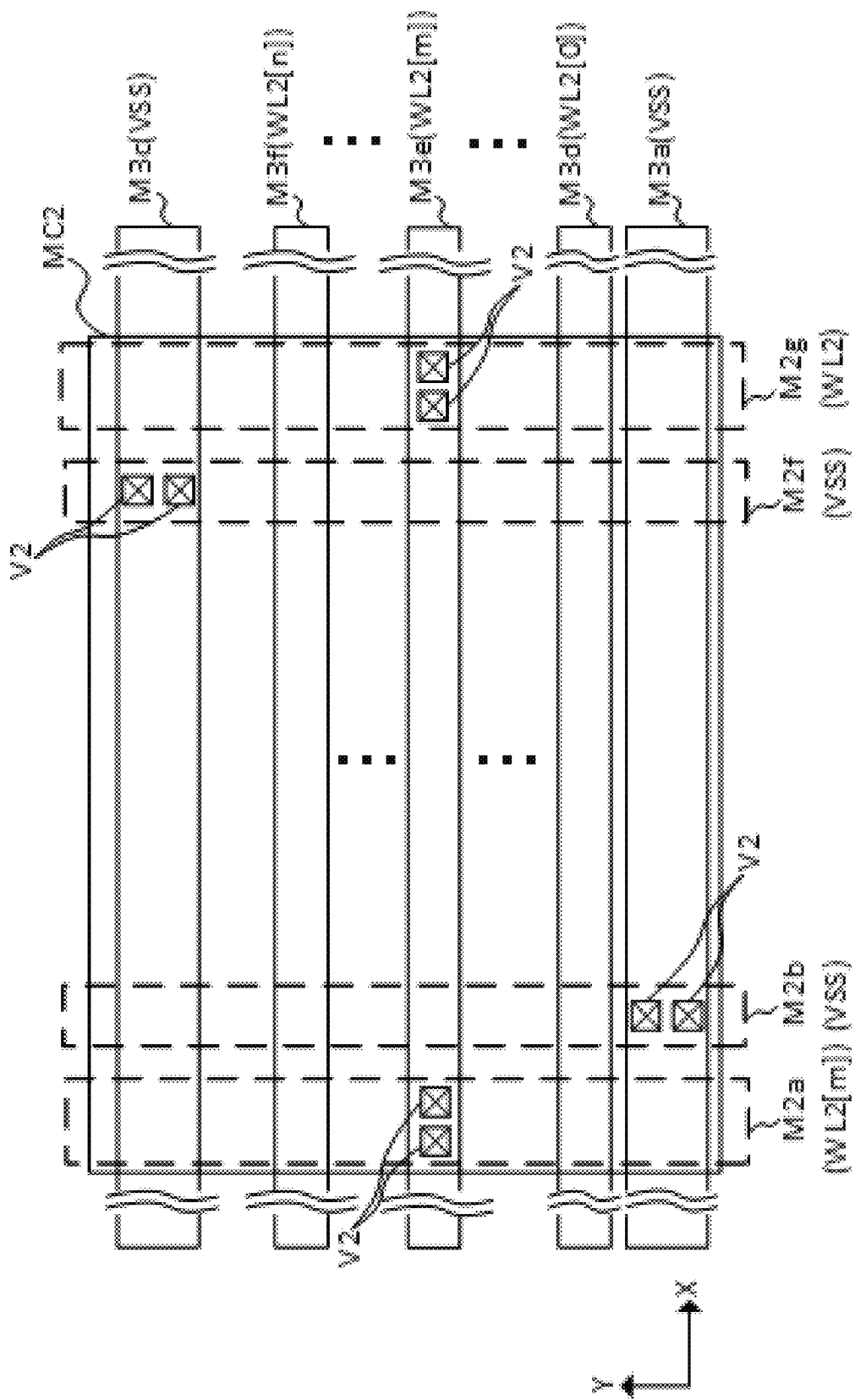
FIG. 11 is a plan layout diagram of the second metal wiring layer and the third metal wiring layer in the upper layer of the second memory cell in the Third Embodiment.

FIG. 10 is a plan layout diagram in an upper layer of the second memory cell MC2 in the present embodiment and shows a layout of the first metal wiring layer M1 and the second metal wiring layer M2 for the second memory cell MC2[m] in the m-th column. FIG. 11 is a plan layout diagram of an upper layer of the second memory cell MC2 in the present embodiment and shows a layout of the second metal wiring layer M2 and the third metal wiring layer M3.

The layout of the wirings of the second metal wiring layers M2 is the same as that of the Second Embodiment. In the third metal wiring layer M3, the third layer fourth wiring M3d constituting the 0-th word line WL[0], the third layer fifth wiring M3e constituting the m-th word line WL[m], and the third layer sixth wiring M3f constituting the n-th word line WL[n] are sequentially arranged in the Y-direction. The third layer fourth wiring M3d constituting the 0-th word line WL[0], the third layer fifth wiring M3e constituting the m-th word line WL[m], and the third layer sixth wiring M3f constituting the n-th word line WL[n] are arranged between the third layer first wiring M3a and the third layer third wiring M3c in the Y-direction.

The second layer first wiring M2a is electrically connected to the third layer fifth wiring M3e constituting the m-th second word line WL2[m] through the second via V2. The second layer seventh wiring M2g is electrically connected to the third layer fifth wiring M3e constituting the m-th second word line WL2[m] through the second via V2.

Present embodiment is effective in reducing power consumed by unselected bit lines. That is, charge can be prevented from being extracted from a pair of bit lines in a column selected by a word line and not selected by the pair of bit lines, which has an effect of reducing power consumption.

Modified Example of the Third Embodiment

The present embodiment differs from the Third Embodiment in a configuration in which a plurality of pairs of bit lines included in the memory cell row MCR are short-circuited and connected to the input/output circuit IO, and in a configuration in which column selection signal are not supplied from the control circuit CTRL to the input/output circuit IO. The rest of the configuration is the same as that of the previous Third Embodiment, and therefore the description thereof is omitted.

Figure 12:
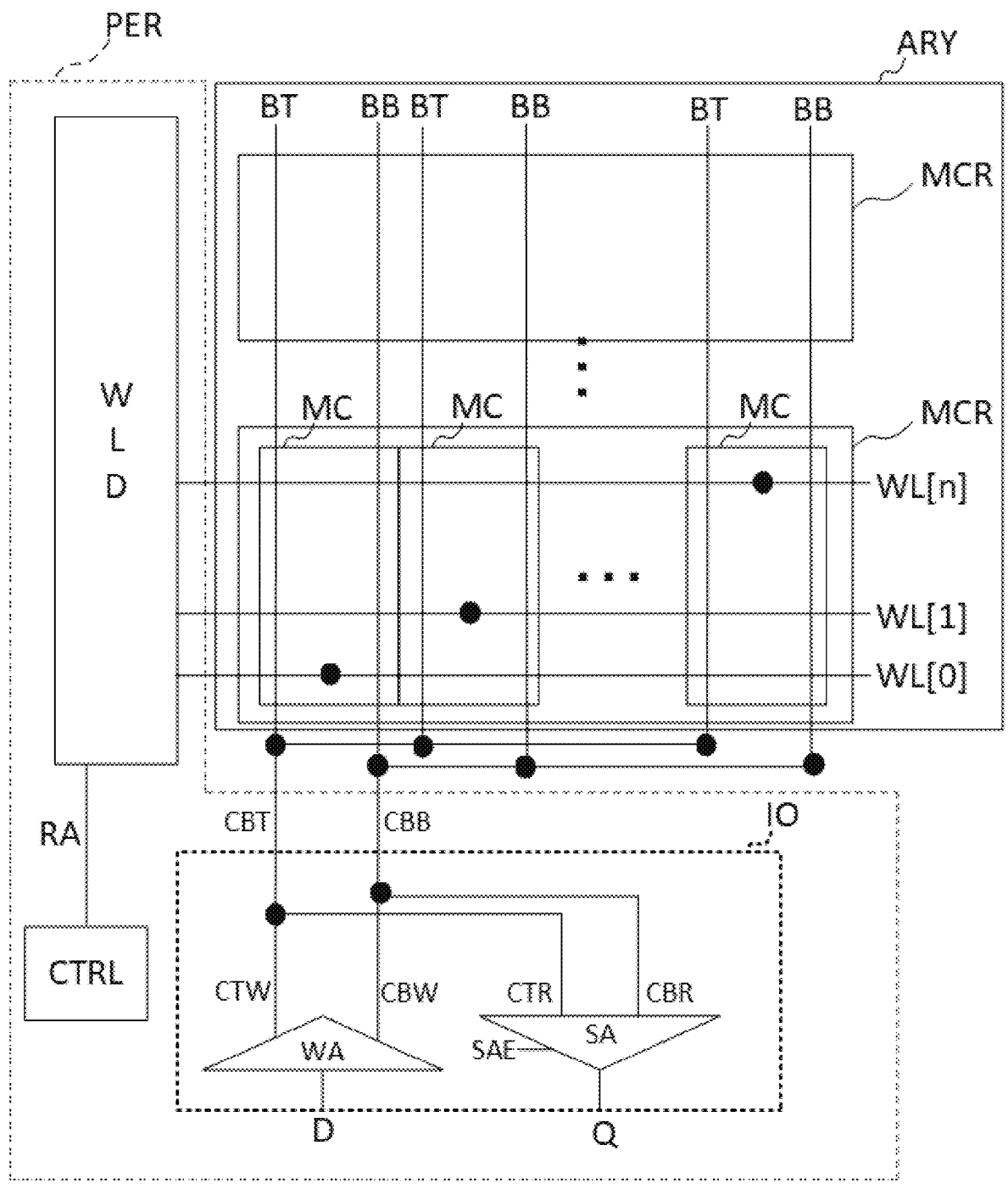
FIG. 12 is a diagram of a second memory circuit in the modified example of the Third Embodiment.

FIG. 12 shows a block diagram of the second memory circuit 301 in the present modified example. Unlike Third Embodiment, the column selection circuit MUX does not exist in the input/output circuit IO. Accordingly, the column address CA is not transmitted from the control circuit CTRL to the input/output circuit IO.

For the respective memory cell columns included in the memory array region ARY, the second bit lines BT2 are short-circuited to each other, and the second bit lines BB2 are also short-circuited to each other. The portion where the second bit lines BT2 are short-circuited to each other and the portion where the second bit lines BB2 are short-circuited to each other are both between the input/output circuit IO and the memory array region ARY. That is, data input/output is performed from the input/output circuit IO to a plurality of memory cell columns through a pair of common bit lines CBT and CBB. The pair of common bit lines CBT and CBB are formed continuously with the second bit lines BT2 and BB2.

In present embodiment, row and column selection can be performed on word lines. Since the column selection circuit MUX are not required, the area of the second memory circuit 301 can be reduced.

Fourth Embodiment

Figure 14:
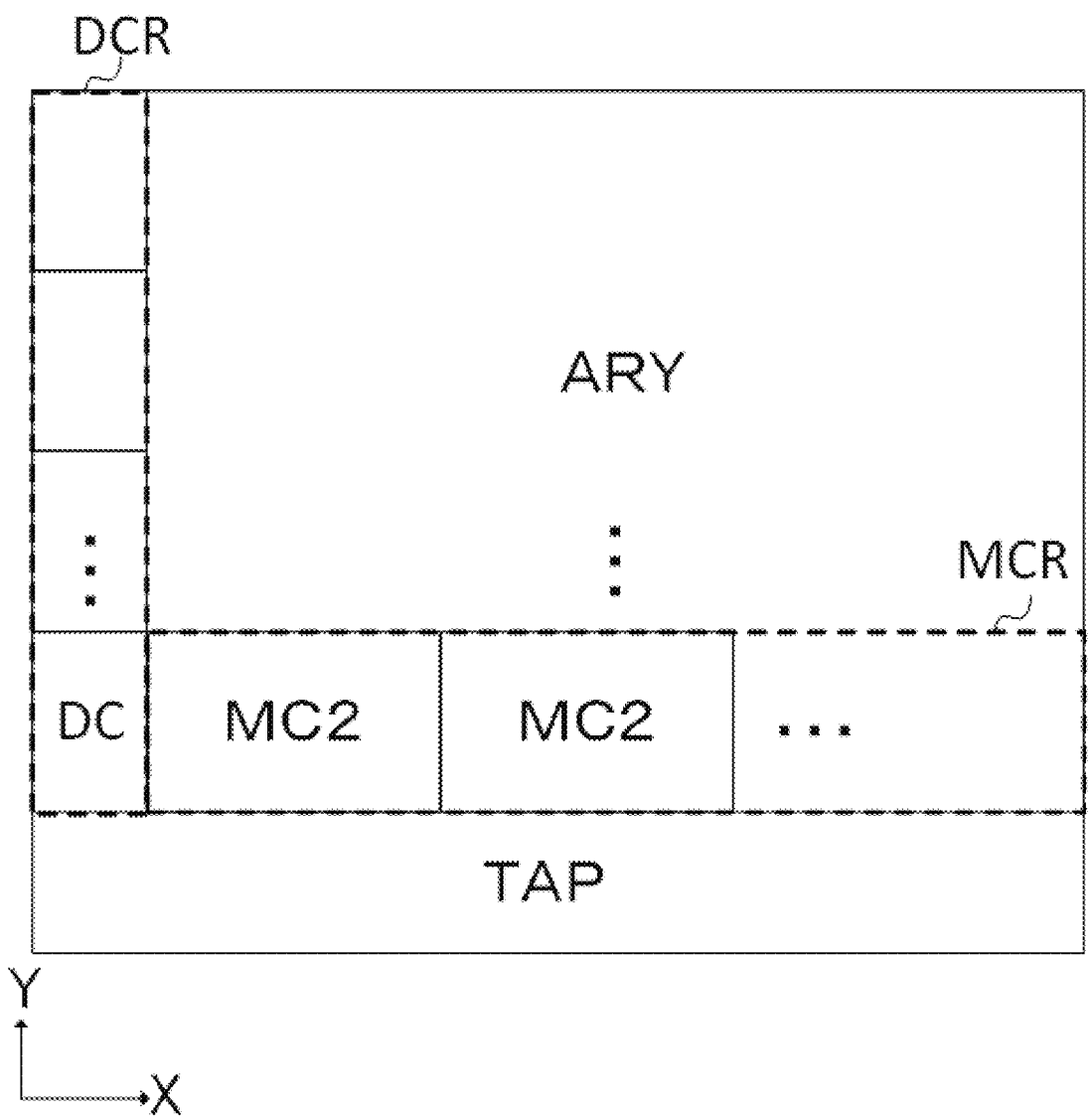
FIG. 14 is a plan layout diagram of a dummy cell in a Fourth Embodiment.

FIG. 14 is a diagram showing the arrangement of power supply region and dummy transistor in the second memory circuit 301. In the present embodiment, a dummy cell region DCR in which a plurality of dummy cells DC are arranged side by side is provided adjacently to the row direction of the memory array region ARY. The rest of the configuration is the same as that of the previous First Embodiment, and therefore the description thereof is omitted.

Power supply regions TAP is arranged adjacent to the memory array region ARY in the Y-direction. Power supply region TAP is a region extending in the X-direction. The power supply region TAP supplies a predetermined potential (e.g., the ground potential VSSp or the first power supply potential VCCp) to the n-well NW and the p-well PW.

The dummy cell region DCR is arranged adjacent to the memory array region ARY in the X-direction. In the dummy cell region DCR, a plurality of dummy cells DC are arranged side by side in the Y-direction. Each of the dummy cells DC is arranged for each memory cell row MCR of the memory array region ARY.

Figure 15:
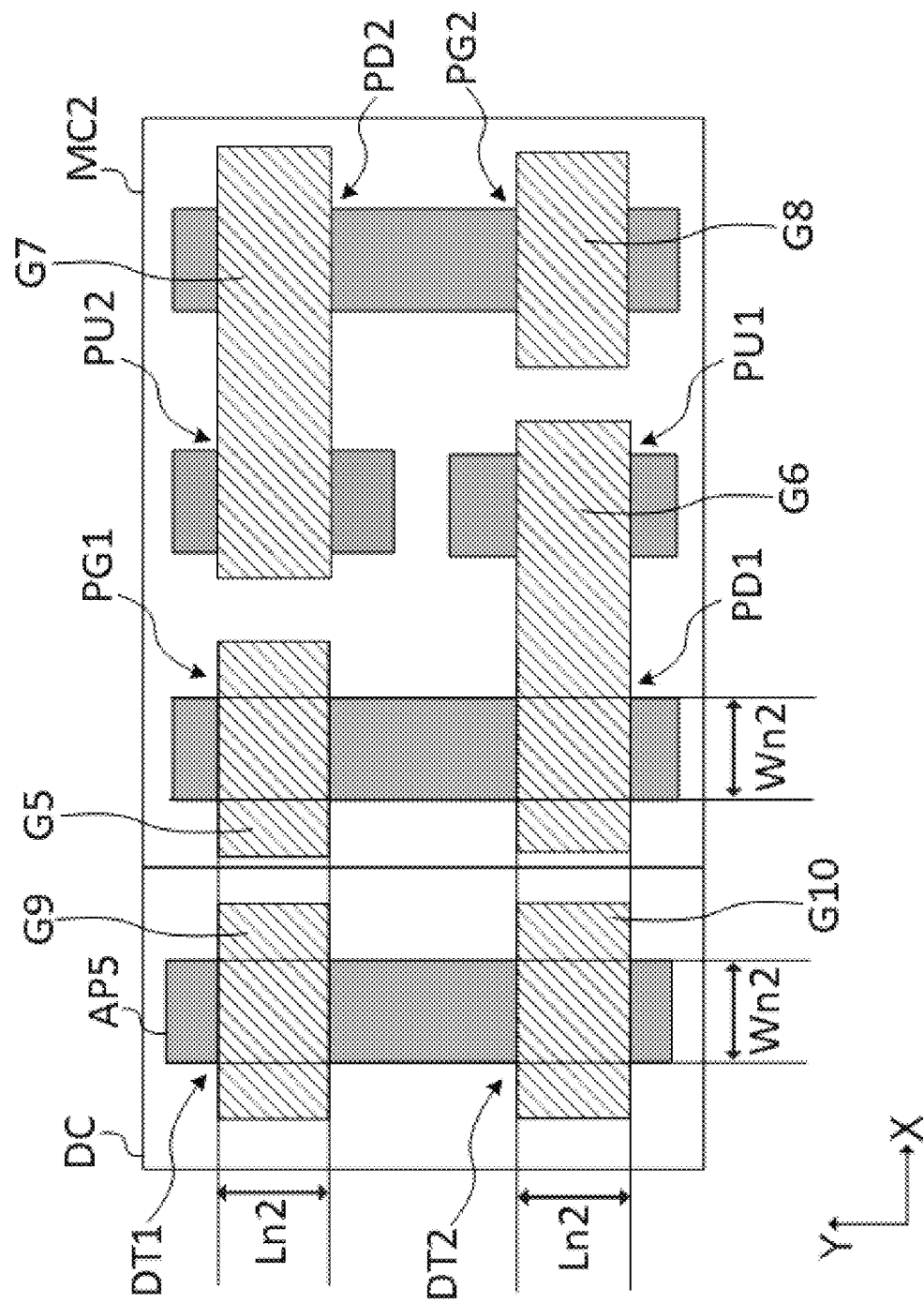
FIG. 15 is a plan layout diagram of a dummy cell in the Fourth Embodiment.

FIG. 15 shows a layout of the dummy cell DC and the second memory cell MC2. The dummy cell DC includes a first dummy transistor DT1 and a second dummy transistor DT2. The gate of the first dummy transistor DT1 is formed of a ninth gate wiring G9. The source and drain of the first dummy transistor are composed of a fifth p-type active region AP5. The gate of the second dummy transistor DT2 is formed of a tenth gate wiring G10. The source and drain of the second dummy transistor are composed of a fifth p-type active region AP5.

The ninth gate wiring G9 is arranged on the extension of the fifth gate wiring G5 in the X-direction. The tenth gate wiring G10 is arranged on the extension of the sixth gate wiring G6 in the X-direction.

The gate length Ln2 of the first dummy transistor DT1 and second dummy transistor DT2 is equal in length to the gate length Ln2 of the third pass gate transistor PG3 and third pull down transistor PD3.

The gate width Wn2 of the first dummy transistor DT1 and the second dummy transistor DT2 are equal to the gate width Wn2 of the third pass gate transistor PG3 and the third pull down transistor PD3.

Unlike the layout of the second memory cell MC2 including six transistors, the dummy cell DC is comprised of two transistors. Therefore, the area of the dummy cell DC is smaller than the area of the second memory cell MC2.

According to the present embodiment, since the gate wirings constituting the dummy cell DC and the gate wirings of the transistor constituting the second memory cell MC2 are symmetrical, manufacturing variations can be suppressed. Further, since the area of the dummy cell DC is smaller than the area of the second memory cell MC2, the area of the dummy cell region DCR can be reduced as compared with when the second memory cell MC2 is arranged in the dummy cell region DCR.

Fifth Embodiment

Figure 17:
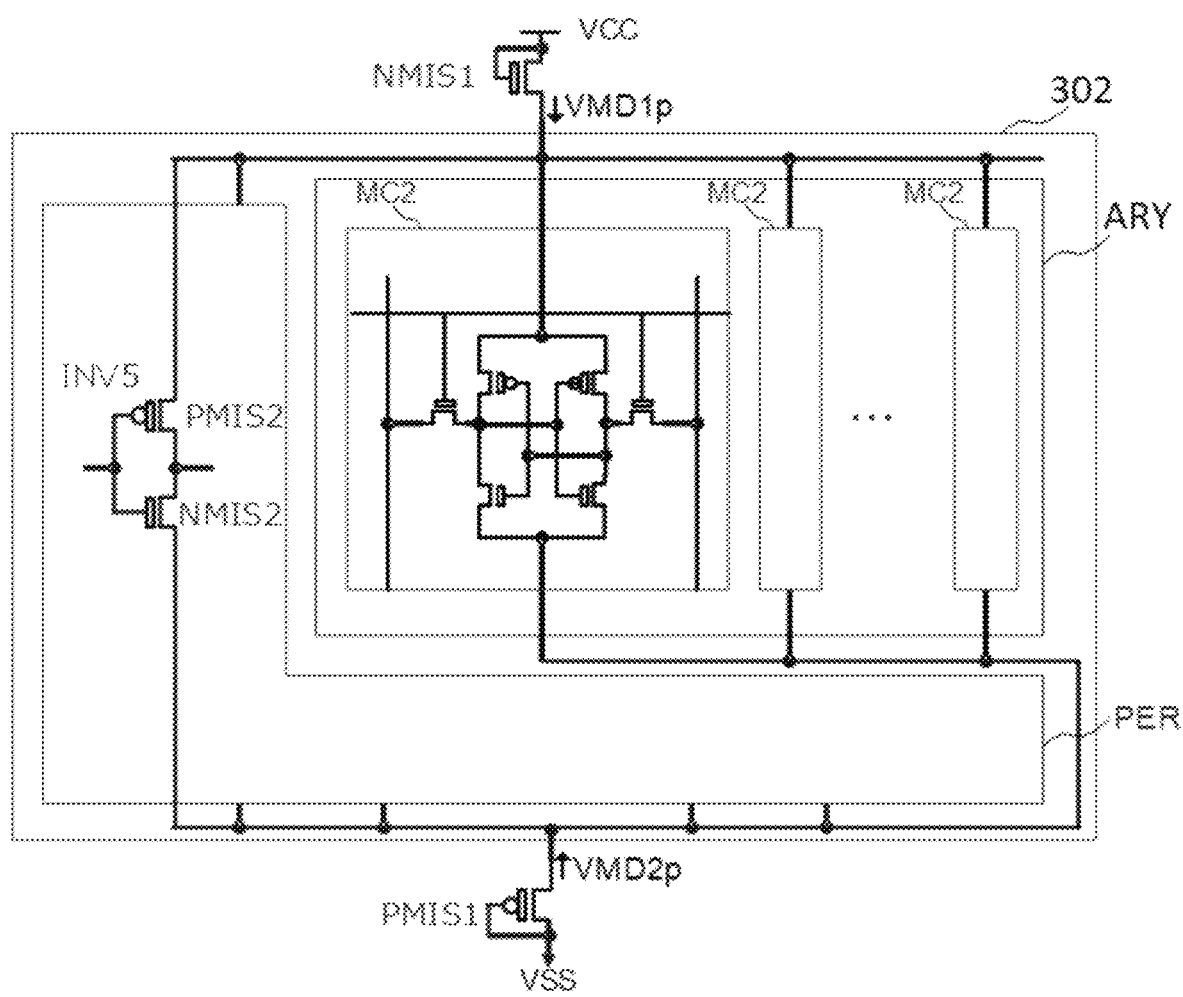
FIG. 17 is a circuit diagram of a second memory circuit in a Fifth Embodiment.

FIG. 17 is a circuit diagram showing a circuit in which the second memory circuit is operated at an intermediate potential. In present embodiment, a first n-channel type field effect transistor NMIS1 is provided between the first power supply VCC supplied to the second memory circuit 301 and the second memory circuit 301, and a first p-channel type field effect transistor PMIS1 is provided between the ground power supply VSS supplied to the second memory circuit 301 and the second memory circuit 301. The rest of the configuration is the same as that of the previous First Embodiment, and therefore the description thereof is omitted.

The first intermediate potential VMD1p dropped by the threshold Vt3 of the first n-channel type field effect transistor NMIS1 is supplied from the first power supply VCC to the second memory cell MC2 through the source-drain path of the first n-channel type field effect transistor NMIS1. The gate and source of the first n-channel type field effect transistor NMIS1 are supplied with a first power supply potential VCCp.

The first intermediate potential VMD1p is supplied to the source of the first pull up transistor PU1 and the source of the second pull up transistor PU2 included in the second memory cell MC2.

From the ground potential VSSp, the second intermediate potential VMD2p whose potential rises by the threshold Vt4 of the first p-channel type field effect transistor PMIS1 is supplied to the second memory cell MC2 through the source-drain path of the first p-channel type field effect transistor PMIS1. The ground potential VSSp is supplied to the gate and the source of the first p-channel type field effect transistor PMIS1.

The second intermediate potential VMD2p is supplied to the source of the first pull down transistor PD1 and the source of the second pull down transistor PD2 of the second memory cell MC2.

In the present Embodiment, the first intermediate potential VMD1p and the second intermediate potential VMD2p are supplied to the peripheral circuit region PER. For example, the first intermediate potential VMD1p and the second intermediate potential VMD2p are supplied to the fifth inverter INV5 included in the peripheral circuit region PER and configured by the second p-channel type field effect transistor PMIS2 and the second n-channel type field effect transistor NMIS2.

Figure 18B:
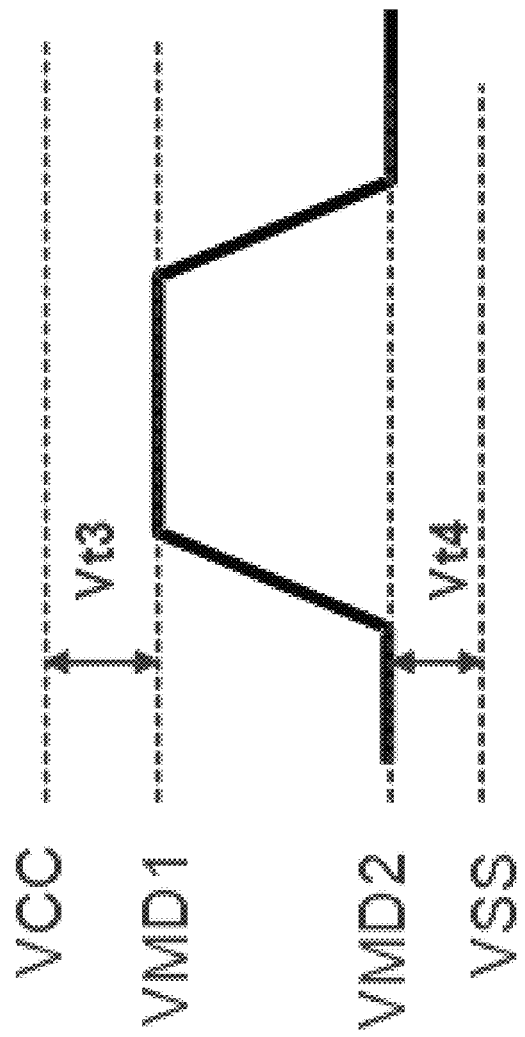
FIG. 18B is a diagram for explaining the effect of the Fifth Embodiment.

FIGS. 18A and 18B are diagrams for explaining the effect of the embodiment. FIG. 18A shows a signal waveform when the intermediate potential of the present embodiment is not used. FIG. 18B shows waveforms of the inner signal of the second memory circuit 301. As shown in FIG. 18B, in the present embodiment, by changing the potentials by the threshold Vt3 of the first n-channel type field effect transistor NMIS1 and the threshold Vt4 of the first p-channel type field effect transistor PMIS1, the amplitude of the inner signal is made smaller than that of the signal shown in FIG. 18A, thereby reducing power consumptions.

It should be noted that the present invention is not limited to the above-mentioned embodiments, and various modifications can be made without departing from the gist thereof.

What is claimed is:

1. A semiconductor device comprising:
   a first memory cell of static type comprised of a first field effect transistor;
   a second memory cell of static type comprised of a second field effect transistor;
   a first memory circuit including the first memory cell;
   a second memory circuit including the second memory cell; and
   a regulator which converts a first power supply potential to a second power supply potential having a voltage value lower than that of the first power supply potential,
   wherein a second gate length of the second field effect transistor is longer than a first gate length of the first field effect transistor,
   wherein the first memory circuit is supplied with the second power supply potential through the regulator, and
   wherein the second memory circuit is supplied with the first power supply potential.

2. The semiconductor device according to claim 1,
   wherein the first memory cell is electrically connected with a first word line and a pair of first bit lines,
   wherein the second memory cell is electrically connected with a second word line and a pair of second bit lines,
   wherein the first memory cell comprises:
      a first inverter comprised of a first pull up transistor and a first pull down transistor;
      a second inverter comprised of a second pull up transistor and a second pull down transistor;
      a first pass gate transistor connected between an input portion of the first inverter and one bit line of the pair of first bit lines; and
      a second pass gate transistor connected between an output portion of the second inverter and the other bit line of the pair of first bit lines,
   wherein the second memory cell comprises:
      a third inverter comprised of a third pull up transistor and a third pull down transistor;
      a fourth inverter comprised of a fourth pull up transistor and a fourth pull down transistor;
      a third pass gate transistor connected between an output portion of the third inverter and one bit line of the pair of second bit lines; and
      a fourth pass gate transistor connected between an output portion of the fourth inverter and the other bit line of the pair of second bit lines,
   wherein each of the first inverter and the second inverter is supplied with the second power supply potential and a third power supply potential,
   wherein each of the third inverter and the fourth inverter is supplied with the first power supply potential and the third power supply potential,
   wherein the third power supply potential is a voltage lower than the second power supply potential, and
   wherein, in a plan view, a second gate width is longer than a width of the second word line arranged to overlap the second memory cell.

3. The semiconductor device according to claim 2,
   wherein the second memory circuit further comprising:
      a memory array region in which a plurality of the second memory cells are arranged in matrix;
      a dummy cell region arranged adjacent to the memory array region in a row direction of the memory array region in plan view; and
      a power supply region arranged adjacent to the memory array region in a column direction of the memory array region in plan view,
   wherein the dummy cell region includes a plurality of dummy transistors each has a gate of the second gate length, and
   wherein each of the plurality of dummy transistors are arranged adjacent to each of gate electrodes of the pass gate transistor and the pull down transistor of the plurality of second memory cells.

4. The semiconductor device according to claim 2,
   wherein the second memory circuit further comprises a third memory cell arranged adjacent to the second memory cell in a row direction,
   wherein a third word line different from the second word line and a pair of third bit lines different from the pair of second bit lines are connected to the third memory cell, and
   wherein the pair of second bit lines and the pair of third bit lines connected to the third memory cell are electrically connected to each other through a pair of common bit lines.

5. The semiconductor device according to claim 1,
   wherein the semiconductor device has a first mode and a second mode different from the first mode, wherein, in the first mode, the second power supply voltage is supplied to the first memory cell through the regulator, and
wherein, in the second mode, a power supply to the regulator is cut off.

6. The semiconductor device according to claim 5,
wherein the first mode is a normal operation mode in which data reading from the first memory cell or data writing to the first memory cell is performed, and
wherein the second mode is a standby mode in which neither data reading from the first memory cell nor data writing to the first memory cell is performed.

7. The semiconductor device according to claim 1, wherein a storage capacity of the second memory circuit is shorter than a storage capacity of the first memory circuit.

8. The semiconductor device according to claim 1, wherein a threshold of the second field effect transistor is higher than a threshold of the first field effect transistor.

9. The semiconductor device according to claim 1,
wherein the first gate length is a distance between a source region and a drain region of the first field effect transistor, and
wherein the second gate length is a distance between a source region and a drain region of the second field effect transistor.

10. A semiconductor device comprising:
a first memory cell of static type including a first field effect transistor;
a second memory cell of static type including a second field effect transistor;
a first memory circuit including the first memory cell;
a second memory circuit including the second memory cell; and
a regulator which converts a first power supply potential to a second power supply potential having a voltage value lower than that of the first power supply potential,
wherein a thickness of a second gate insulating film of the second field effect transistor is thicker than a thickness of a first gate insulating film of the first field effect transistor,
wherein, in a first mode, the first memory cell is supplied with the second power supply potential through the regulator,
wherein, in a second mode, the second memory cell is supplied with the first power supply potential,
wherein, in the first mode, the first memory circuit is supplied with the second power supply potential through the regulator, and
wherein, in the second mode, the first power supply potential supplied to the regulator is cut off.

11. The semiconductor device according to claim 10,
wherein the first memory cell is electrically connected with a first word line and a pair of first bit lines,
wherein the second memory cell is electrically connected with a second word line and a pair of second bit lines,
wherein the first memory cell comprises:
a first inverter comprised of a first pull up transistor and a first pull down transistor;
a second inverter comprised of a second pull up transistor and a second pull down transistor;
a first pass gate transistor connected between an input portion of the first inverter and one bit line of the pair of first bit lines; and
a second pass gate transistor connected between an output portion of the second inverter and the other bit line of the pair of first bit lines,
wherein the second memory cell comprises:
a third inverter comprised of a third pull up transistor and a third pull down transistor;
a fourth inverter comprised of a fourth pull up transistor and a fourth pull down transistor;
a third pass gate transistor connected between an output portion of the third inverter and one bit line of the pair of second bit lines; and
a fourth pass gate transistor connected between an output portion of the fourth inverter and the other bit line of the pair of second bit lines,
wherein each of the first inverter and the second inverter is supplied with the second power supply potential and a third power supply potential lower than the second power supply potential, and
wherein each of the third inverter and the fourth inverter is supplied with the first power supply potential and the third power supply potential.

12. The semiconductor device according to claim 11,
wherein the second memory circuit further comprises a third memory cell arranged adjacent to the second memory cell in a row direction,
wherein a third word line different from the second word line and a pair of third bit lines different from the pair of second bit lines are connected to the third memory cell, and
wherein the pair of second bit lines and the pair of third bit lines connected to the third memory cell are electrically connected to each other through a pair of common bit lines.

13. The semiconductor device according to claim 10,
wherein the first mode is a normal operation mode in which data reading or data writing is performed in the first memory circuit, and
wherein the second mode is a standby mode in which neither data reading nor data writing is performed in the first memory circuit.

14. The semiconductor device according to claim 13,
wherein, in the first mode, data reading from the first memory cell or data writing to the first memory cell is performed, and
wherein, in the second mode, neither data reading from the first memory cell nor data writing to the first memory cell is performed.

15. The semiconductor device according to claim 10, wherein a storage capacity of the second memory circuit is shorter than a storage capacity of the first memory circuit.

16. The semiconductor device according to claim 10,
wherein the second memory circuit further comprising:
a memory array region in which a plurality of the second memory cells are arranged in matrix;
a dummy cell region arranged adjacent to the memory array region in a row direction of the memory array region in plan view; and
a power supply region arranged adjacent to the memory array region in a column direction of the memory array region in plan view,
wherein the dummy cell region includes a plurality of dummy transistors each having a gate of a second gate length, and
wherein each of the plurality of dummy transistors are arranged adjacent to each of gate electrodes of a pass gate transistor and the pull down transistor of the plurality of second memory cells.

17. The semiconductor device according to claim 10, wherein a threshold of the second field effect transistor is higher than a threshold of the first field effect transistor.

* * * * *